US012720756B2

(12) United States Patent
Myeong et al.

(10) Patent No.: US 12,720,756 B2
(45) Date of Patent: Aug. 25, 2026

(54) SEMICONDUCTOR MEMORY DEVICE AND ELECTRONIC SYSTEM INCLUDING THE SAME

(71) Applicant: Samsung Electronics Co., Ltd., Suwon-si (KR)

(72) Inventors: Il Ho Myeong, Suwon-si (KR); Su Seong Noh, Suwon-si (KR); Seung Min Lee, Suwon-si (KR); Sang Woo Han, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 271 days.

(21) Appl. No.: 18/587,355

(22) Filed: Feb. 26, 2024

(65) Prior Publication Data

US 2025/0048642 A1 Feb. 6, 2025

(30) Foreign Application Priority Data

Aug. 4, 2023 (KR) ........................ 10-2023-0101929

(51) Int. Cl.
*H10B 51/20* (2023.01)
*H10B 51/30* (2023.01)

(52) U.S. Cl.
CPC ............. *H10B 51/20* (2023.02); *H10B 51/30* (2023.02)

(58) Field of Classification Search
CPC ................................ H10B 51/20; H10B 51/30
See application file for complete search history.

(56) References Cited

U.S. PATENT DOCUMENTS

| | | | |
|---|---|---|---|
| 11,469,251 | B2 | 10/2022 | Zhang et al. |
| 11,594,553 | B2 | 2/2023 | Sharangpani et al. |
| 2022/0181353 | A1 | 6/2022 | Lee et al. |
| 2022/0278201 | A1 | 9/2022 | Kim et al. |
| 2023/0068706 | A1 | 3/2023 | Bae et al. |

FOREIGN PATENT DOCUMENTS

| | | | |
|---|---|---|---|
| KR | 2010-0091900 | A | 8/2010 |
| KR | 2013-0124289 | A | 11/2013 |
| KR | 2021-0143076 | A | 11/2021 |
| KR | 2021-0152378 | A | 12/2021 |

*Primary Examiner* — Samuel A Gebremariam
(74) *Attorney, Agent, or Firm* — Harness, Dickey & Pierce, P.L.C.

(57) ABSTRACT

A semiconductor memory device includes a substrate, a mold structure including a plurality of gate electrodes and a plurality of mold insulating films alternately stacked on the substrate, a channel structure extending in a first direction and penetrating the mold structure, the channel structure including a semiconductor pattern and a ferroelectric film between the semiconductor pattern and the plurality of gate electrodes, a channel pad on the channel structure, and a bit line contact connected to the channel pad, wherein an uppermost part of the ferroelectric film protrudes beyond an uppermost gate electrode among the plurality of gate electrodes, the channel pad includes a first portion in contact with the semiconductor pattern and a second portion in contact with the first portion and the bit line contact, the first portion has a first width, and the second portion has a second width greater than the first width.

20 Claims, 20 Drawing Sheets

SEMICONDUCTOR MEMORY DEVICE AND ELECTRONIC SYSTEM INCLUDING THE SAME

CROSS-REFERENCE TO RELATED APPLICATION

This application claims priority from Korean Patent Application No. 10-2023-0101929 filed on Aug. 4, 2023 in the Korean Intellectual Property Office, and all the benefits accruing therefrom under 35 U.S.C. 119, the contents of which in their entirety are herein incorporated by reference.

BACKGROUND

1. Field

The present disclosure relates to semiconductor memory devices and/or electronic systems including the same. More for example, the present disclosure relates to a three-dimensional semiconductor memory devices including memory cells arranged three-dimensionally and/or electronic systems including the same.

2. Description of the Related Art

There is a need to increase the degree of integration of a semiconductor memory device to satisfy excellent performance and low price required by consumers. In the case of the semiconductor memory device, because the degree of integration is an important factor in determining the price of a product, an increased degree of integration is particularly required.

In the case of a two-dimensional or planar semiconductor memory device, the degree of integration is mainly determined by an area occupied by unit memory cells, and is therefore greatly affected by the level of fine pattern forming technology. However, since ultra-expensive apparatuses are required to miniaturize the pattern, the degree of integration of the two-dimensional semiconductor device is increasing, but is still limited. Accordingly, three-dimensional semiconductor devices including memory cells arranged three-dimensionally have been proposed.

SUMMARY

Some example embodiments of the present disclosure provide semiconductor memory devices having improved durability and reliability.

Some example embodiments of the present disclosure also provide electronic systems including a semiconductor memory device having improved durability and reliability.

However, example embodiments of the present disclosure are not restricted to the example embodiments set forth herein. The above and other aspects of the present disclosure will become more apparent to one of ordinary skill in the art to which the present disclosure pertains by referencing the detailed description of the present disclosure given below.

According to an example embodiment of the present disclosure, a semiconductor memory device may include a substrate, a mold structure including a plurality of gate electrodes and a plurality of mold insulating films alternately stacked on the substrate, a channel structure extending in a first direction and penetrating the mold structure, the channel structure including a semiconductor pattern and a ferroelectric film between the semiconductor pattern and the plurality of gate electrodes, a channel pad on the channel structure, and a bit line contact connected to the channel pad, wherein an uppermost part of the ferroelectric film protrudes beyond an uppermost gate electrode among the plurality of gate electrodes, the channel pad includes a first portion that is in contact with the semiconductor pattern, and a second portion that is in contact with the first portion and the bit line contact, the first portion has a first width, and the second portion has a second width greater than the first width.

According to an example embodiment of the present disclosure, a semiconductor memory device may include a substrate, a mold structure including a plurality of gate electrodes and a plurality of mold insulating films alternately stacked on the substrate, a channel structure extending in a first direction and penetrating the mold structure, and a channel pad on the channel structure, the channel pad including a first portion having a first width, and a second portion having a second width greater than the first width, wherein the channel structure includes a semiconductor pattern, a first interfacial film on the semiconductor pattern, a first ferroelectric film on the first interfacial film, a second interfacial film on the first ferroelectric film, and a second ferroelectric film on the second interfacial film.

According to an example embodiment of the present disclosure, an electronic system may include a main board, a semiconductor memory device on the main board, and a controller on the main board and electrically connected to the semiconductor memory device, wherein the semiconductor memory device includes a substrate, a mold structure including a plurality of gate electrodes and a plurality of mold insulating films alternately stacked on the substrate, a channel structure extending in a first direction and penetrating the mold structure, the channel structure including a semiconductor pattern, and a ferroelectric film between the semiconductor pattern and the plurality of gate electrodes, a channel pad on the channel structure, and a bit line contact connected to the channel pad, wherein an uppermost part of the ferroelectric film protrudes beyond an uppermost gate electrode among the plurality of gate electrodes, and the channel pad includes a first portion in contact with the semiconductor pattern, and a second portion in contact with the first portion and the bit line contact, the first portion has a first width, and the second portion has a second width greater than the first width.

BRIEF DESCRIPTION OF DRAWINGS

The above and other aspects and features of the present disclosure will become more apparent by describing in detail some illustrative example embodiments thereof with reference to the attached drawings, in which:

FIG. 3 is an example layout diagram for explaining the semiconductor memory device according to an example embodiment;

FIG. 4 is a cross-sectional view taken along a line A-A of FIG. 3;

DETAILED DESCRIPTION

As used herein, expressions such as "at least one of," when preceding a list of elements, modify the entire list of elements and do not modify the individual elements of the list. Thus, for example, both "at least one of A, B, or C" and "at least one of A, B, and C" mean either A, B, C or any combination thereof. Likewise, A and/or B means A, B, or A and B.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

A semiconductor memory device according to example embodiments will be described below with reference to FIGS. 1 to 7.

Figure 1:
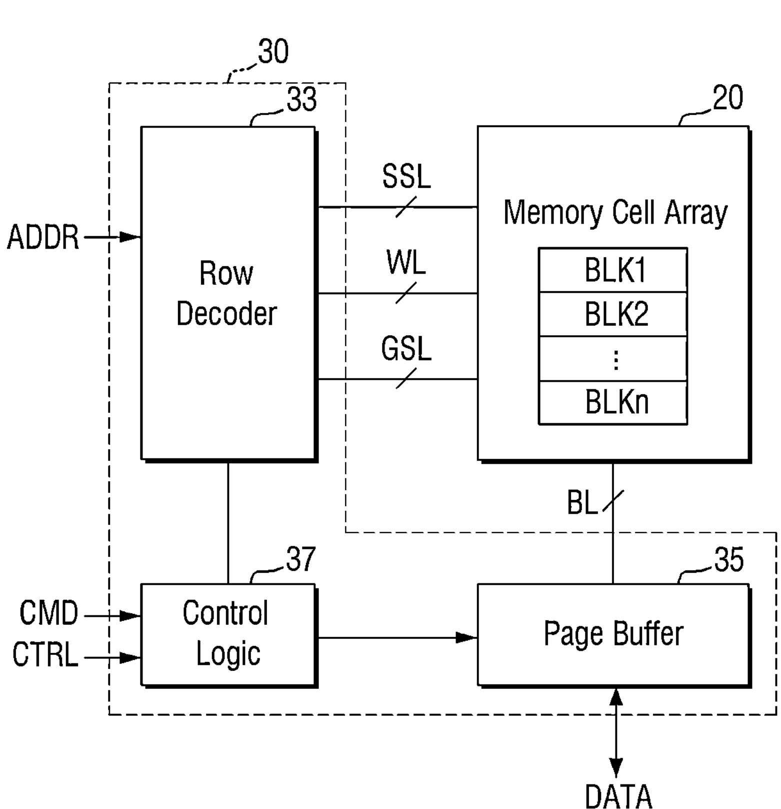
FIG. 1 is an example block diagram for explaining the semiconductor memory device according to an example embodiment.

FIG. 1 is an example block diagram for explaining the semiconductor memory device according to an example embodiment.

Referring to FIG. 1, a semiconductor memory device 10 according to an example embodiment includes a memory cell array 20 and a peripheral circuit 30.

The memory cell array 20 may include a plurality of memory cell blocks BLK1 to BLKn. Each of the memory cell blocks BLK1 to BLKn may include a plurality of memory cells. The memory cell array 20 may be connected to the peripheral circuit 30 through bit lines BL, word lines WL, at least one string selection line SSL, and at least one ground selection line GSL. For example, the memory cell blocks BLK1 to BLKn may be connected to a row decoder 33 through the word lines WL, the string selection line SSL, and the ground selection line GSL. Further, the memory cell blocks BLK1 to BLKn may be connected to a page buffer 35 through the bit lines BL.

The peripheral circuit 30 may receive an address ADDR, a command CMD, and a control signal CTRL from the outside of the semiconductor memory device 10, and may transmit and receive data DATA to and from an external device of the semiconductor memory device 10. The peripheral circuit 30 may include a control logic 37, a row decoder 33, and a page buffer 35. Although not shown, the peripheral circuit 30 may further include various sub-circuits such as an input/output circuit, a voltage generation circuit that generates various voltages desired for the operation of the semiconductor memory device 10, and an error correction circuit for correcting an error of the data DATA that is read from the memory cell array 20.

The control logic 37 may be connected to the row decoder 33, the input/output circuit, and the voltage generation circuit. The control logic 37 may control the overall operation of the semiconductor memory device 10. The control logic 37 may generate various internal control signals used inside the semiconductor memory device 10 in response to the control signal CTRL. For example, the control logic 37 may adjust the voltage levels provided to the word line WL and the bit line BL when performing a memory operation such as a program operation or an erasure operation.

The row decoder 33 may select at least one of the plurality of memory cell blocks BLK1 to BLKn in response to the address ADDR, and may select at least one word line WL, at least one string selection line SSL, and at least one ground selection line GSL of the selected memory cell blocks BLK1 to BLKn. The row decoder 33 may transmit a voltage for performing the memory operation to the word line WL of the selected memory cell blocks BLK1 to BLKn.

The page buffer 35 may be connected to the memory cell array 20 through the bit line BL. The page buffer 35 may operate as a writer driver or a sense amplifier. For example, at the time of the program operation, the page buffer 35 may operate as the writer driver to apply a voltage according to the data DATA to be stored in the memory cell array 20 to the bit line BL. On the other hand, at the time of performing the read operation, the page buffer 35 may operate as a sense amplifier to sense the data DATA stored in the memory cell array 20.

Figure 2:
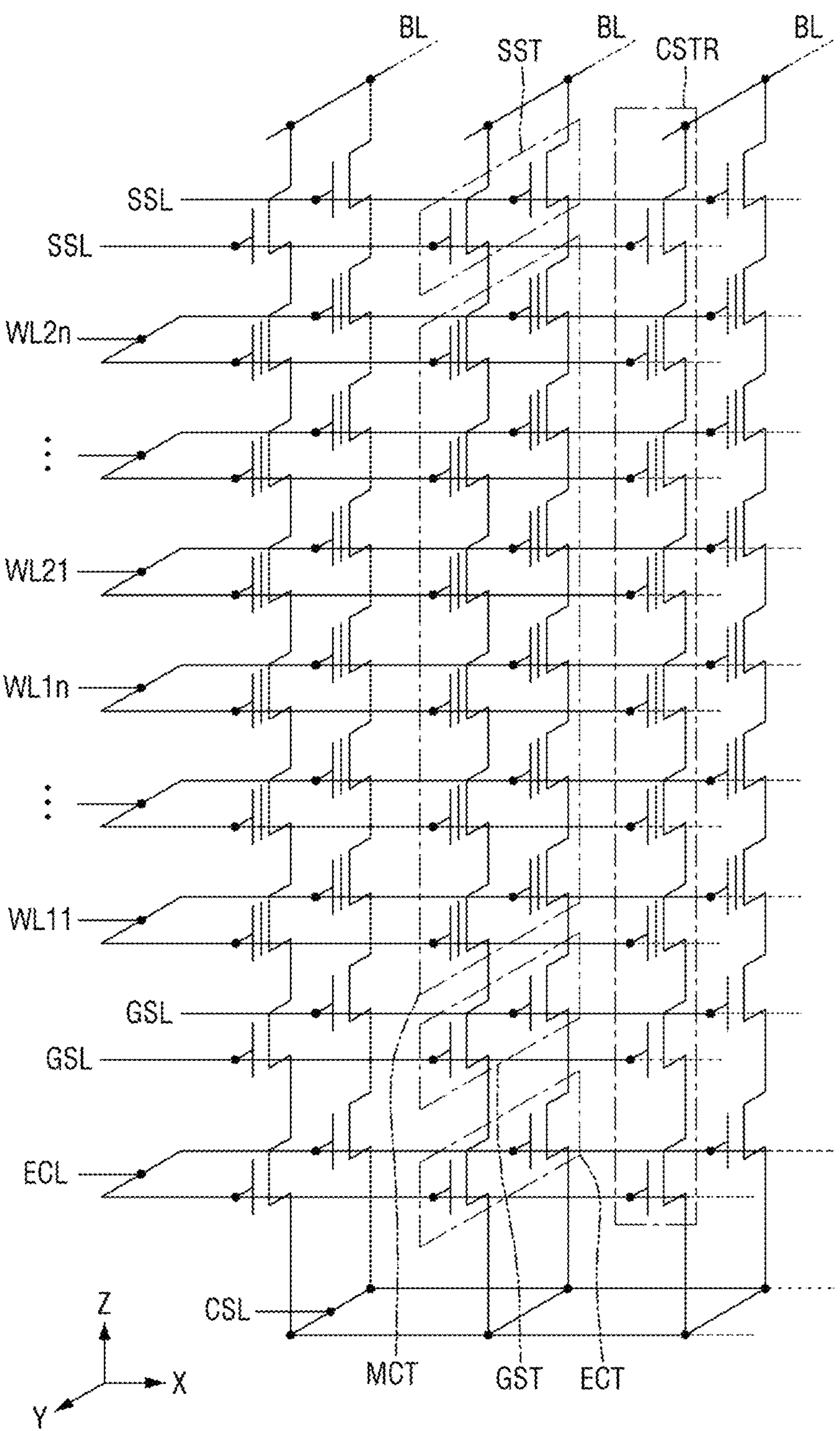
FIG. 2 is an example circuit diagram for explaining a semiconductor memory device according to an example embodiment.

FIG. 2 is an example circuit diagram for explaining a semiconductor memory device according to an example embodiment.

Referring to FIG. 2, a memory cell array (e.g., 20 of FIG. 1) of the semiconductor device according to an example embodiment may include a common source line CSL, a plurality of bit lines BL, and a plurality of cell strings CSTR.

The common source line CSL may extend in a first direction (e.g., X direction). In some example embodiments, the plurality of common source lines CSL may be arranged two-dimensionally. For example, a plurality of common source lines CSL may extend in the first direction X while being spaced apart from each other. The common source line CSL may be electrically applied with the same voltage, or may be applied with different voltages and controlled separately.

A plurality of bit lines BL may be arranged two-dimensionally. For example, the bit lines BL may each extend in a second direction (e.g., Y direction) that intersects the first direction X while being spaced apart from each other. A plurality of cell strings CSTR may be connected in parallel to each bit line BL. The cell strings CSTR may be commonly connected to a common source line CSL. That is, a plurality of cell strings CSTR may be disposed between the bit line BL and the common source line CSL.

Each cell string CSTR may include a ground selection transistor GST connected to the common source line CSL, a string selection transistor SST connected to the bit line BL, and a plurality of memory cell transistors MCT disposed between the ground selection transistor GST and the string selection transistor SST. Each memory cell transistor MCT may include a data storage element. The ground selection transistor GST, the string selection transistor SST, and the memory cell transistors MCT may be connected in series.

The common source line CSL may be commonly connected to sources of the ground selection transistors GST. Further, a ground selection line GSL, a plurality of word lines WL11 to WL1*n* and WL21 to WL2*n*, and a string selection line SSL may be disposed between the common source line CSL and the bit line BL. The ground selection line GSL may be used as a gate electrode of the ground selection transistor GST, the word lines WL11 to WL1*n* and WL21 to WL2*n* may be used as the gate electrodes of the memory cell transistors MCT, and the string selection line SSL may be used as the gate electrode of the string selection transistor SST.

In some example embodiments, an erasure control transistor ECT may be disposed between the common source line CSL and the ground selection transistor GST. The common source line CSL may be commonly connected to the sources of the erasure control transistors ECT. Further, an erasure control line ECL may be disposed between the common source line CSL and the ground selection line GSL. The erasure control line ECL may be used as the gate electrode of the erasure control transistor ECT. The erasure control transistors ECT may generate a gate induced drain leakage (GIDL) to perform the erasure operation of the memory cell array.

Figure 3:
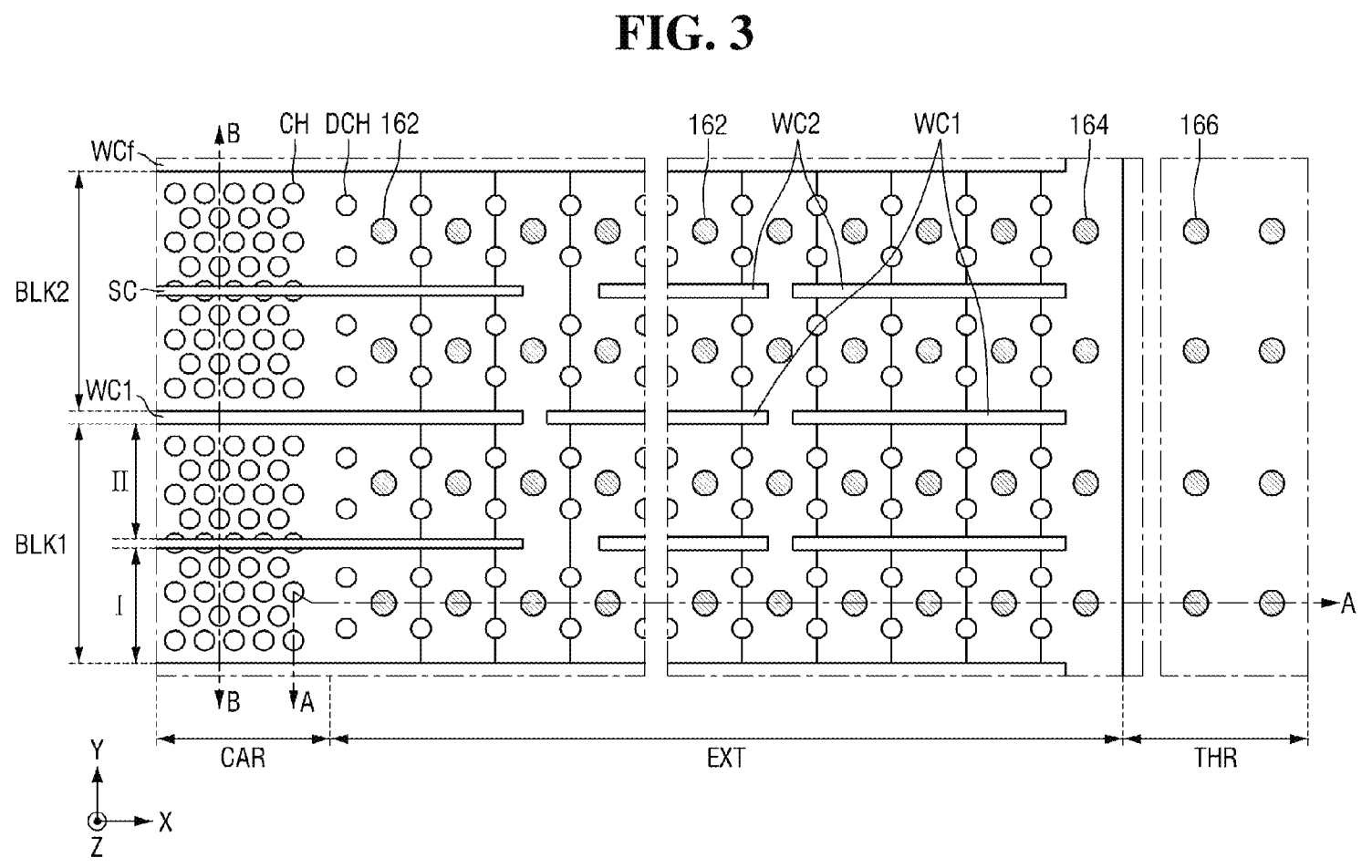
Figure 4:
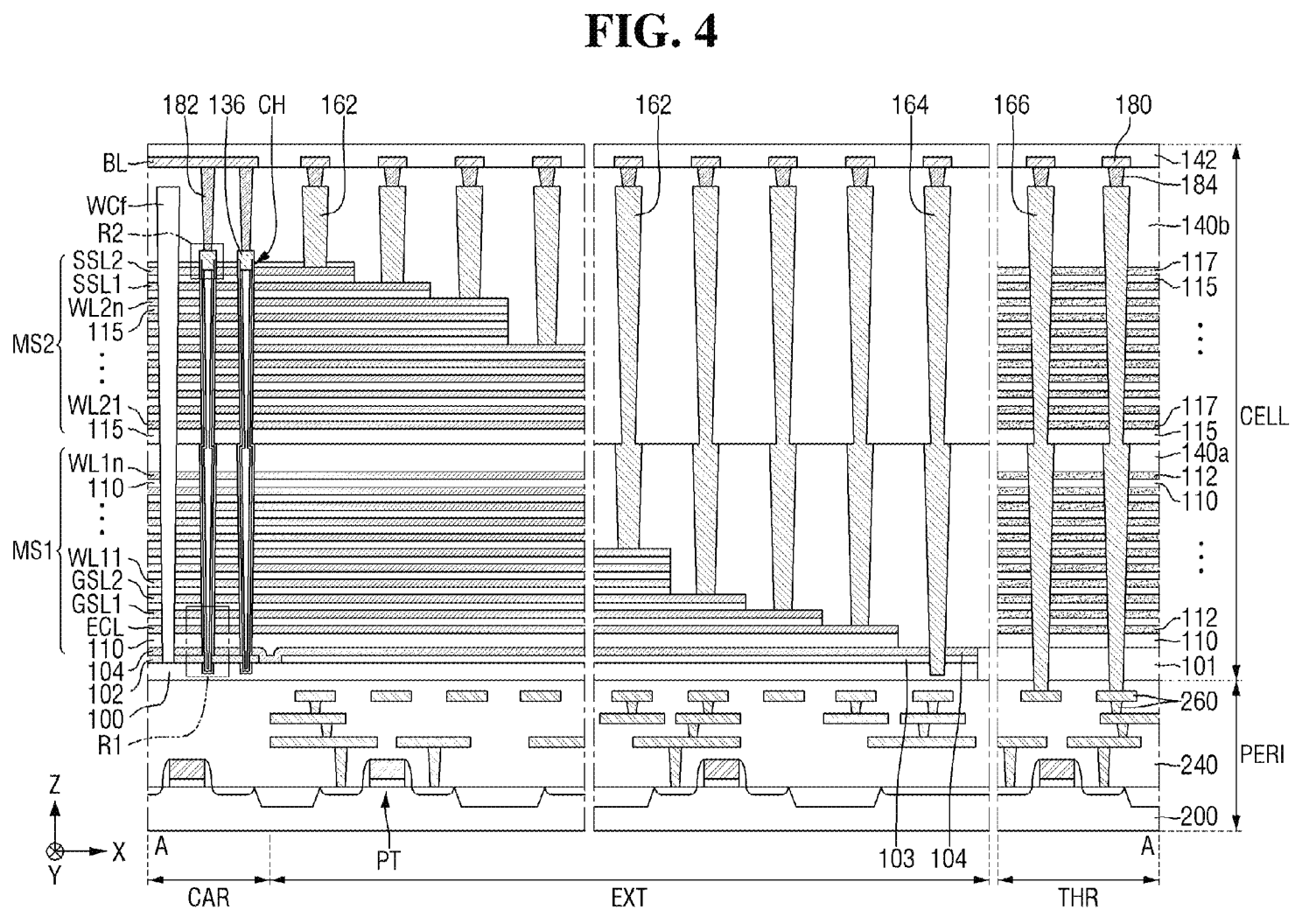
Figure 5:
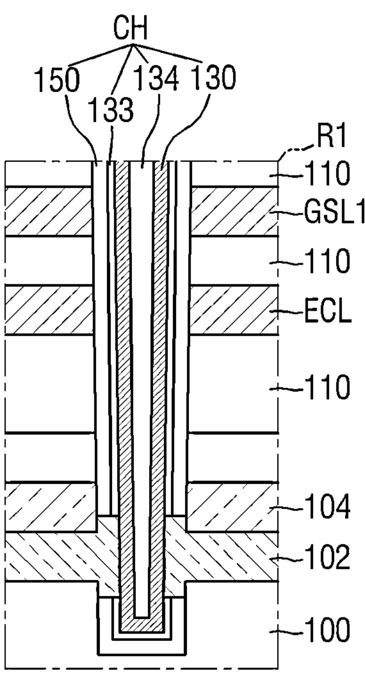
FIG. 5 is an enlarged view for explaining a region R1 of FIG. 4.
Figure 6:
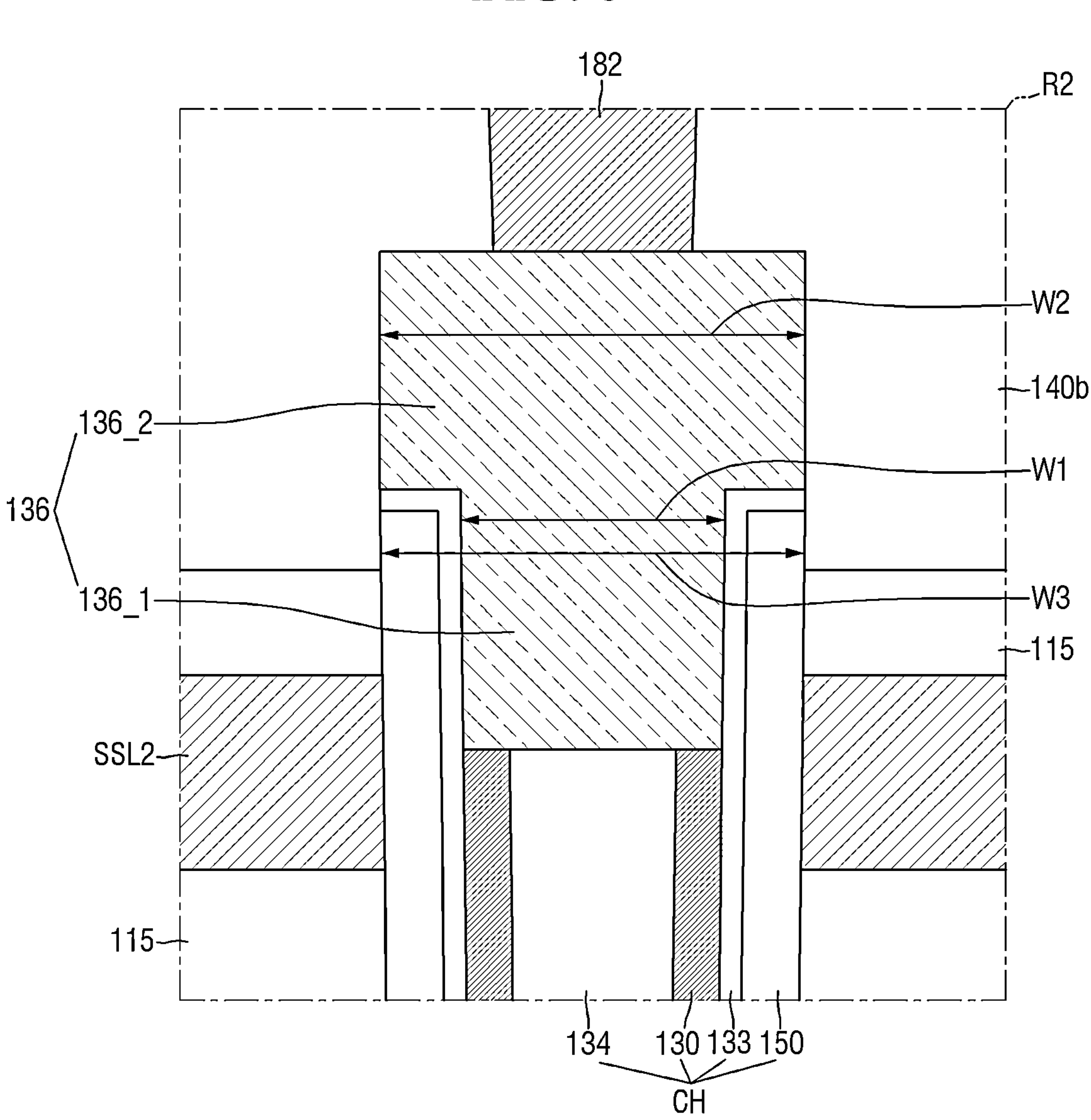
FIG. 6 is an enlarged view for explaining a region R2 of FIG. 4.
Figure 7:
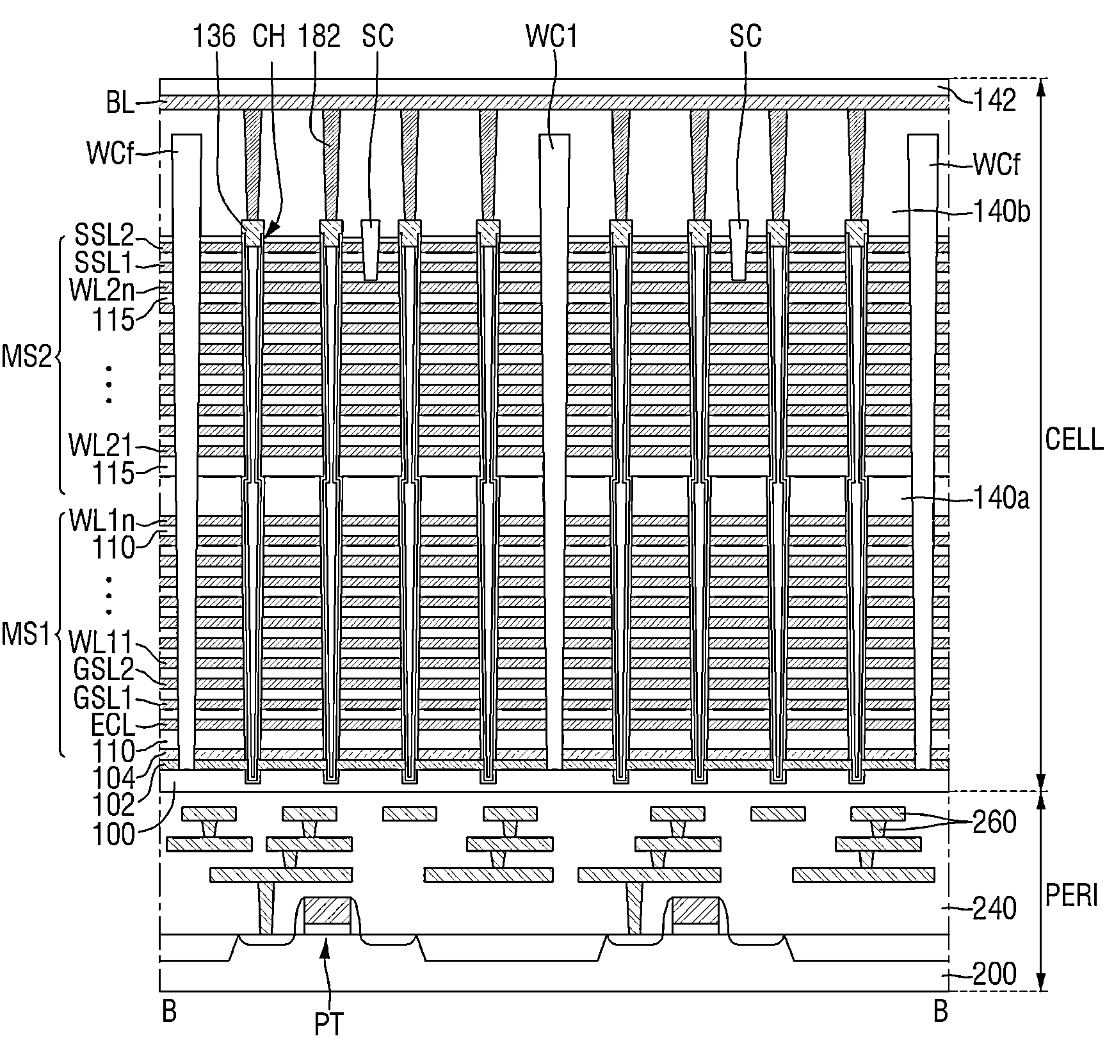
FIG. 7 is a cross-sectional view taken along a line B-B of FIG. 3.

FIG. 3 is an example layout diagram for explaining the semiconductor memory device according to an example embodiment. FIG. 4 is a cross-sectional view taken along a line A-A of FIG. 3. FIG. 5 is an enlarged view for explaining a region R1 of FIG. 4. FIG. 6 is an enlarged view for explaining a region R2 of FIG. 4. FIG. 7 is a cross-sectional view taken along a line B-B of FIG. 3.

Referring to FIGS. 3 to 7, the semiconductor memory device according to an example embodiment includes a memory cell region CELL and a peripheral circuit region PERI.

The memory cell region CELL may include a cell substrate 100, an insulating substrate 101, mold structures MS1 and MS2, interlayer insulating films 140*a* and 140*b*, a channel structure CH, a channel pad 136, a block isolation region WCf, a bit line BL, a cell contact 162, a source contact 164, a through via 166, and a first wiring structure 180.

The cell substrate 100 may include, for example, a semiconductor substrate such as a silicon substrate, a germanium substrate or a silicon-germanium substrate. In some example embodiments, the cell substrate 100 may include a silicon-on-insulator (SOI) substrate, a germanium-on-insulator (GOI) substrate, or the like. In some example embodiments, the cell substrate 100 may include impurities. For example, the cell substrate 100 may include n-type impurities (e.g., phosphorus (P), arsenic (As), etc.).

The cell substrate 100 may include a cell array region CAR and an extension region EXT.

A memory cell array (e.g., 20 of FIG. 1) including a plurality of memory cells may be disposed on the cell array region CA. For example, a channel structure CH, a bit line BL, and gate electrodes ECL, GSL1, GSL2, WL11 to WL1*n*, WL21 to WL2*n*, SSL1, and SSL2, and the like, which will be described later, may be disposed on the cell array region CA. In the following description, the surface of the cell substrate 100 on which the memory cell array is disposed may be referred to as a front side of the cell substrate 100. In contrast, a surface of the cell substrate 100 opposite to the front side of the cell substrate 100 may be referred to as a back side of the cell substrate 100.

The extension region EXT may be disposed around the cell array region CA. The gate electrodes ECL, GSL1, GSL2, WL11 to WL1*n*, WL21 to WL2*n*, SSL1, and SSL2 may be stacked stepwise in the extension region EXT.

In some example embodiments, the cell substrate 100 may further include a through region THR. Through region THR may be disposed inside the cell array region CAR and the extension region EXT, or may be disposed outside the cell array region CAR and the extension region EXT. A through via 166, which will be described below, may be disposed inside the through region THR.

The insulating substrate 101 may be formed inside the cell substrate 100 of the extension region EXT. The insulating substrate 101 may form an insulating region inside the cell substrate 100 of the extension region EXT. The insulating substrate 101 may include, for example, but not limited to, at least one of silicon oxide, silicon nitride, silicon oxynitride, or silicon carbide. In some example embodiments, the insulating substrate 101 may be formed inside the cell substrate 100 of the through region THR.

Although the lower surface of the insulating substrate 101 is only shown to be coplanar with the lower side of the cell substrate 100, this is only an example. As another example, the lower side of the insulating substrate 101 may be lower than the lower side of the cell substrate 100.

The mold structures MS1 and MS2 may be formed on the front side of the cell substrate 100. The mold structures MS1 and MS2 include a plurality of gate electrodes ECL, GSL1, GSL2, WL11 to WL1*n*, WL21 to WL2*n*, SSL1, and SSL2 and a plurality of mold insulating films 110 and 115 that are stacked on the cell substrate 100. Each of the gate electrodes ECL, GSL1, GSL2, WL11 to WL1*n*, WL21 to WL2*n*, SSL1, and SSL2 and each of the mold insulating films 110 and 115 may be a layered structure that extends parallel to the front side of the cell substrate 100. The gate electrodes ECL, GSL1, GSL2, WL11 to WL1*n*, WL21 to WL2*n*, SSL1, and SSL2 are spaced apart from each other by the mold insulating films 110 and 115, and may be sequentially stacked on the cell substrate 100.

In some example embodiments, the mold structures MS1 and MS2 may include a first mold stack MS1 and a second mold stack MS2 that are stacked sequentially on the cell substrate 100.

The first mold structure MS1 may include first gate electrodes ECL, GSL1, GSL2, and WL11 to WL1*n* and first mold insulating films 110 that are alternately stacked on the cell substrate 100. In some example embodiments, the first gate electrodes ECL, GSL1, GSL2, and WL11 to WL1*n* may include the erasure control line ECL, ground selection lines GSL1 and GSL2, and a plurality of first word lines WL11 to WL1*n*, which are sequentially stacked on the cell substrate 100. The ground selection lines GSL1 and GSL2 may include a first ground selection line GSL1 and a second ground selection line GSL2 that are stacked in order. Although the first gate electrodes ECL, GSL1, GSL2, and WL11 to WL1n are only shown to include two ground selection lines GSL1 and GSL2, this is only an example, and the first gate electrodes ECL, GSL1, GSL2, and WL11 to WL1n may, of course, include three or more ground selection lines. In some other example embodiments, the erasure control line ECL may be omitted.

The second mold structure MS2 may include second gate electrodes WL21 to WL2n, SSL1, and SSL2 and second mold insulating films 115 that are alternately stacked on the first mold structure MS1. In some example embodiments, the second gate electrodes WL21 to WL2n, SSL1, and SSL2 may include a plurality of second word lines WL21 to WL2n and string selection lines SSL1 and SSL2 that are sequentially stacked on the first mold structure MS1. The string selection lines SSL1 and SSL2 may include a first string selection line SSL1 and a second string selection line SSL2 that are stacked in order. Although the second gate electrodes WL21 to WL2n, SSL1, and SSL2 are only shown to include two string selection lines SSL1 and SSL2, this is only an example, and the second gate electrodes WL21 to WL2n, SSL1, and SSL2 may, of course, include three or more string selection lines.

The gate electrodes ECL, GSL1, GSL2, WL11 to WL1n, WL21 to WL2n, SSL1, and SSL2 may each include, but not limited to, conductive materials, for example, metal such as tungsten (W), cobalt (Co), and nickel (Ni), or a semiconductor material such as silicon.

Each of the mold insulating films 110 and 115 may include, but not limited to, an insulating material, for example, at least one of silicon oxide, silicon nitride or silicon oxynitride.

In some example embodiments, the mold structures MS1 and MS2 of the through region THR may include the plurality of mold sacrificial films 112 and 117 and the plurality of mold insulating films 110 and 115 that are alternately stacked on the cell substrate 100 and/or the insulating substrate 101. Each of the mold sacrificial films 112 and 117 and each of the mold insulating films 110 and 115 may be a layered structure extending parallel to the upper side of the cell substrate 100. The mold sacrificial films 112 and 117 are sequentially stacked on the cell substrate 100 while being spaced apart from each other by the mold insulating films 110 and 115.

In some example embodiments, the first mold structure MS1 of the through region THR may include first mold sacrificial films 112 and first mold insulating films 110 that are alternately stacked on the cell substrate 100, and the second mold structure MS2 of the through region THR may include second mold sacrificial films 117 and second mold insulating films 115 that are alternately stacked on the first mold structure MS1.

The mold sacrificial films 112 and 117 may each include an insulating material, for example, but not limited to, at least one of silicon oxide, silicon nitride or silicon oxynitride. In some example embodiments, the mold sacrificial films 112 and 117 may include materials that have an etching selectivity with respect to the mold insulating films 110 and 115. As an example, the mold insulating films 110 and 115 may include silicon oxide, and the mold sacrificial films 112 and 117 may include silicon nitride.

The interlayer insulating films 140a and 140b may be formed on the cell substrate 100 to cover the mold structures MS1 and MS2. In some example embodiments, the interlayer insulating films 140a and 140b may include a first interlayer insulating film 140a and a second interlayer insulating film 140b that are sequentially stacked on the cell substrate 100. The first interlayer insulating film 140a may cover the first mold structure MS1, and the second interlayer insulating film 140b may cover the second mold structure MS2. The interlayer insulating films 140a and 140b may include, for example, but not limited to, at least one of silicon oxide, silicon oxynitride, or a low-k material having a lower dielectric constant than silicon oxide.

The channel structure CH may be formed inside the mold structures MS1 and MS2 of the cell array region CA. The channel structure CH may extend in a vertical direction (hereinafter referred to as a third direction Z) intersecting the upper side of the cell substrate 100, and penetrate the mold structures MS1 and MS2. For example, the channel structure CH may have a pillar shape (e.g., a cylindrical shape) extending in the third direction Z. Therefore, the channel structure CH may intersect each of the gate electrodes ECL, GSL1, GSL2, WL11 to WL1n, WL21 to WL2n, SSL1, and SSL2.

As shown in FIGS. 5 and 6, the channel structure CH may include a semiconductor pattern 130, an interfacial film 133, and a ferroelectric film 150.

The semiconductor pattern 130 may extend in the third direction Z and penetrate the mold structures MS1 and MS2. Although the semiconductor pattern 130 is only shown to have a cup shape, this is only an example. For example, the semiconductor pattern 130 may have various shapes such as a cylindrical shape, a rectangular barrel shape, and a solid filler shape. The semiconductor pattern 130 may include, for example, but not limited to, a semiconductor material such as monocrystalline silicon, polycrystalline silicon, organic semiconductor substance and carbon nanostructure.

The interfacial film 133 may be disposed on the semiconductor pattern 130. The interfacial film 133 may be interposed between the semiconductor pattern 130 and each of the gate electrodes ECL, GSL1, GSL2, WL11 to WL1n, WL21 to WL2n, SSL1, and SSL2. For example, the interfacial film 133 may extend along the outer side face of the semiconductor pattern 130. The interfacial film 133 may include, for example, silicon oxide or a high dielectric constant material (e.g., aluminum oxide ($Al_2O_3$)) having a higher dielectric constant than silicon oxide, and at least one of silicon oxide or silicon nitride.

The ferroelectric film 150 may be disposed on the interfacial film 133. The ferroelectric film 150 may be in contact with each of the gate electrodes ECL, GSL1, GSL2, WL11 to WL1n, WL21 to WL2n, SSL1, and SSL2. The ferroelectric film 150 may be disposed on the outermost part of the channel structure CH. The ferroelectric film 150 may be disposed between the semiconductor pattern 130 and each of the gate electrodes ECL, GSL1, GSL2, WL11 to WL1n, WL21 to WL2n, SSL1, and SSL2. The ferroelectric film 150 may extend along the outer side face of the interfacial film 133.

The ferroelectric film 150 may include a ferroelectricity material. For example, the ferroelectric film 150 may include a hafnium-based compound having ferroelectric properties. As an example, the ferroelectric film 150 may include $HfO_2$, HfZnO, HfSiO, HfSiON, HfTaO, HfTiO, HfZrO, or combinations thereof. Also, the ferroelectric film 150 may include a ferroelectricity material of a perovskite structure, such as PZT($PbZrxTi1\text{-}xO_3$), $BaTiO_3$, and $PbTiO_3$. The ferroelectric film 150 may include at least one dopant selected from carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), or lanthanum (La). The ferroelectric film 150 may be made of a crystalline structure. For example, the ferroelectric film 150 may have crystal structure of an orthorhombic system.

The channel pad 136 may be disposed on the channel structure CH. The channel pad 136 may cover the upper part of the channel structure CH. For example, the channel pad 136 may cover the upper side of the filling pattern 134, the upper side of the semiconductor pattern 130 and the upper side of the interfacial film 133. The channel pad 136 may include, for example, but not limited to, impurity-doped polysilicon.

An example shape of the channel pad 136 will be described below with reference to FIG. 6.

The channel pad 136 may include a first portion 136_1 and a second portion 136_2. The first portion 136_1 of the channel pad 136 may have a first width W1. Here, the first width W1 may be a width of the first portion 136_1 in the first direction X or the second direction Y. The second portion 136_2 of the channel pad 136 may have a second width W2. The second width W2 is greater than the first width W1. Here, the second width W2 may be a width of the second portion 136_2 in the first direction X or the second direction Y.

The first portion 136_1 of the channel pad 136 may be disposed on the upper side of the semiconductor pattern 130 and the upper side of the filling pattern 134. The first portion 136_1 may cover the upper side of the semiconductor pattern 130 and the upper side of the filling pattern 134. A part of the interfacial film 133 may be disposed between the first portion 136_1 and the ferroelectric film 150. In other words, a part of the interfacial film 133 may overlap the first portion 136_1 in the first direction X and the second direction Y. A first width W1 of the first portion 136_1 may be the same as a width of the semiconductor pattern 130.

The second portion 136_2 of the channel pad 136 may be disposed on the first portion 136_1. The second portion 136_2 may be in contact with the bit line contact 182. The second portion 136_2 may be electrically connected to the bit line contact 182. The second portion 136_2 may be disposed between the first portion 136_1 and the bit line contact 182. The second portion 136_2 may cover the upper side of the ferroelectric film 150. The second portion 136_2 may be in contact with the upper side of the interfacial film 133.

The uppermost part of the ferroelectric film 150 may protrude beyond the upper side of the second mold structure MS2. For example, the uppermost part of the ferroelectric film 150 may protrude in the third direction Z beyond the upper side of the second mold insulating film 115 disposed on the uppermost part of the second mold structure MS2. The second interlayer insulating film **140*b* may be disposed on the second mold insulating film 115 disposed on the uppermost part. A boundary between the uppermost second mold insulating film 115 and the second interlayer insulating film 140*b* may not be distinguished. The uppermost part of the ferroelectric film 150 protrudes in the third direction Z beyond the upper side of the gate electrode SSL2 disposed on the uppermost part of the second mold structure MS2**.

A part of the interfacial film 133 may cover the upper side of the ferroelectric film 150. A part of the interfacial film 133 may be disposed between the upper side of the ferroelectric film 150 and the second portion 136_2 of the channel pad 136. The upper part of the interfacial film 133 may have an L shape rotated by 180 degrees.

The channel pad 136 may have a T-shape. The second width W2 of the second portion 136_2 may be the same as a width W3 of the uppermost part of the channel structure CH. However, example embodiment are not limited thereto. For example, the second width W2 of the second portion 136_2 may be different from the width W3 of the uppermost part of the channel structure CH. The width of the uppermost part of the channel structure CH may refer to a width of the uppermost part of the ferroelectric film 150.

In some example embodiments, the channel structure CH may further include a filling pattern 134. The filling pattern 134 may be formed to fill the inside of the cup-shaped semiconductor pattern 130. The filling pattern 134 may include an insulating material, for example, but not limited to, silicon oxide.

In some example embodiments, the plurality of channel structures CH may be arranged in the form of a zigzag. For example, as shown in FIG. 3, the plurality of channel structures CH may be arranged alternately in the first direction X and the second direction Y parallel to the upper side of the cell substrate 100. The plurality of channel structures CH arranged in the form of a zigzag may further improve the degree of integration of the semiconductor memory device. In some example embodiments, the plurality of channel structures CH may be arranged in the form of a honeycomb.

In some example embodiments, a dummy channel structure DCS may be formed inside the mold structures MS1 and MS2 of the extension region EXT. The dummy channel structure DCS may be formed, for example, in a shape similar to the channel structure CS to reduce the stress applied to the mold structures MS1 and MS2 of the extension region EXT.

In some example embodiments, first source structures 102 and 104 may be formed on the cell substrate 100. The first source structures 102 and 104 may be interposed between the cell substrate 100 and the mold structures MS1 and MS2. For example, the first source structures 102 and 104 may extend along the upper side of the cell substrate 100. The first source structures 102 and 104 may be connected to the semiconductor pattern 130 of the channel structure CH. For example, as shown in FIG. 5, the first source structures 102 and 104 may penetrate the ferroelectric film 150 and the interfacial film 133 (collectively, referred to an information storage film) and be connected to the semiconductor pattern 130. Such first source structures 102 and 104 may be provided as a common source line (e.g., CSL of FIG. 2) of the semiconductor memory device. The first source structures 102 and 104 may include, for example, but are not limited to, impurity-doped polysilicon or metal.

In some example embodiments, the channel structure CH may penetrate the first source structures 102 and 104. For example, the lower part of the channel structure CH may penetrate the first source structures 102 and 104, and be disposed inside the cell substrate 100.

In some example embodiments, the first source structures 102 and 104 may be formed of multiple films. For example, the first source structures 102 and 104 may include a first source layer 102 and a second source layer 104 that are sequentially stacked on the cell substrate 100. The first source layer 102 and the second source layer 104 may each include, but not limited to, impurity-doped polysilicon or impurity-undoped polysilicon. The first source layer 102 may be in contact with the semiconductor pattern 130 and provided as a common source line (e.g., CSL of FIG. 2) of the semiconductor memory device. The second source layer 104 may be used as a support layer for mitigating or preventing collapse or falling of the mold stack in a replacement process for forming the first source layer 102.

Although not shown, a base insulating film may be interposed between the cell substrate 100 and the first source structures 102 and 104. The base insulating film may include, for example, but not limited to, at least one of silicon oxide, silicon nitride or silicon oxynitride.

In some example embodiments, the first source structures 102 and 104 may not be formed inside the extension region EXT in which the insulating substrate 101 is formed. Although the upper side of the insulating substrate 101 is only shown to be coplanar with the upper sides of the first source structures 102 and 104, this is only an example. As another example, the upper side of the insulating substrate 101 may be higher than the upper sides of the first source structures 102 and 104.

In some example embodiments, a source sacrificial film 103 may be formed on a part of the cell substrate 100. For example, the source sacrificial film 103 may be formed on a part of the cell substrate 100 of the extension region EXT. The source sacrificial film 103 may include a material having an etching selectivity with respect to the mold insulating films 110 and 115. As an example, the mold insulating films 110 and 115 may include silicon oxide, and the source sacrificial film 103 may include silicon nitride. The source sacrificial film 103 may be a layer that remains after a part thereof is replaced with the first source layer 102 in the manufacturing process of the first source structures 102 and 104.

The block isolation region WCf, the first partial isolation region WC1, and the second partial isolation region WC2 may each extend in the first direction X to cut the mold structures MS1 and MS2. The block isolation region WCf may completely cut the mold structures MS1 and MS2. For example, the block separation region WCf may extend continuously in the first direction X. The first partial isolation region WC1 and the second partial isolation region WC2 may partially cut the mold structures MS1 and MS2, respectively. For example, the first partial isolation regions WC1 of a first row arranged along the first direction X may be spaced apart from each other to partially cut the mold structures MS1 and MS2, and the second partial isolation regions WC2 of the first row arranged along the first direction X may be spaced apart from each other to partially cut the mold structures MS1 and MS2.

A string isolation structure SC may extend in the first direction X to cut the string selection lines SSL1 and SSL2. For example, the string isolation structure SC formed in the first cell block BLK1 may divide the string selection lines SSL1 and SSL2 into a first zone I and a second zone II, respectively. Accordingly, the first string selection line SSL1 of the first zone I and the first string selection line SSL1 of the second zone II may be separated and separately controlled, and the first string selection line SSL2 of the first zone I and the second string selection line SSL2 of the second zone II may be separated and separately controlled.

The string isolation structure SC may include an insulating material, for example, but not limited to, at least one of silicon oxide, silicon nitride or silicon oxynitride.

The bit lines BL may be formed on the mold structures MS1 and MS2. The bit line BL may extend in the second direction Y and intersect the block isolation region WCf. Further, the bit line BL may extend in the second direction Y, and be connected to a plurality of channel structures CH arranged along the second direction Y. For example, a bit line contact 182 connected to the uppermost parts of each channel structure CH may be formed inside the second interlayer insulating film 140*b*. The bit line BL may be electrically connected to the channel structure CH through the bit line contact 182.

The cell contact 162 may be connected to each of the gate electrodes ECL, GSL1, GSL2, WL11 to WL1*n*, WL21 to WL2*n*, SSL1, and SSL2. For example, the cell contacts 162 may extend in the third direction Z inside the interlayer insulating films 140*a* and 140*b*, and be connected to each of the gate electrodes ECL, GSL1, GSL2, WL11 to WL1*n*, WL21 to WL2*n*, SSL1, and SSL2. In some example embodiments, the cell contact 162 may have a bent part between the first mold structure MS1 and the second mold structure MS2.

The source contact 164 may be connected to the first source structure 102 and 104. For example, the source contact 164 may extend in the third direction Z inside the interlayer insulating films 140*a* and 140*b*, and be connected to the cell substrate 100. In some example embodiments, the source contact 164 may have a bent part between the first mold structure MS1 and the second mold structure MS2.

The through via 166 may be disposed inside the through region THR. For example, the through via 166 may extend in the third direction Z inside the mold structures MS1 and MS2 of the through region THR. In some example embodiments, the through via 166 may have a bent part between the first mold structure MS1 and the second mold structure MS2. Although the through via 166 is only shown to penetrate the mold structures MS1 and MS2, this is only an example. As another example, the through via 166 may be disposed outside the mold structures MS1 and MS2, and may not penetrate the mold structures MS1 and MS2.

The cell contact 162, the source contact 164 and the through via 166 may be connected to the first wiring structure 180 on the interlayer insulating films 140*a* and 140*b*, respectively. For example, the first inter-wiring insulating film 142 may be formed on the second interlayer insulating film 140*b*. The first wiring structure 180 may be formed inside the first inter-wiring insulating film 142. The cell contact 162, the source contact 164 and the through via 166 may each be connected to the first wiring structure 180 by the contact via 184. Although not for example shown, the first wiring structure 180 may be connected to the bit line BL.

The peripheral circuit region PERI may include a peripheral circuit board 200, a peripheral circuit element PT, and a second wiring structure 260.

The peripheral circuit board 200 may be disposed below the cell substrate 100. For example, the upper side of the peripheral circuit board 200 may be opposite to the lower side of the cell substrate 100. The peripheral circuit board 200 may include, for example, a semiconductor substrate such as a silicon substrate, a germanium substrate or a silicon-germanium substrate. In some example embodiments, the peripheral circuit board 200 may include a silicon-on-insulator (SOI) substrate or a germanium-on-insulator (GOI) substrate.

The peripheral circuit element PT may be formed on the peripheral circuit board 200. The peripheral circuit element PT may constitute a peripheral circuit (e.g., 30 of FIG. 1) that controls the operation of the semiconductor memory device. For example, the peripheral circuit element PT may include control logic (e.g., 37 of FIG. 1), a row decoder (e.g., 33 of FIG. 1), a page buffer (e.g., 35 of FIG. 1), and the like. In the following description, the surface of the peripheral circuit board 200 on which the peripheral circuit elements PT are disposed may be referred to as a front side of the peripheral circuit board 200. Conversely, a surface of the peripheral circuit board 200 opposite to the front side of the peripheral circuit board 200 may be referred to as a back side of the peripheral circuit board 200.

The peripheral circuit element PT may include, for example, but not limited to, a transistor. For example, the peripheral circuit element PT may include not only various active elements such as a transistor, but also various passive elements such as a capacitor, a resistor and an inductor.

In some example embodiments, the back side of the cell substrate 100 may be opposite to the front side of the peripheral circuit board 200. For example, a second inter-wiring insulating film 240 that covers the peripheral circuit element PT may be formed on the front side of the peripheral circuit board 200. The cell substrate 100 and/or the insulating substrate 101 may be stacked on the upper surface of the second inter-wiring insulating film 240.

The first wiring structure 180 may be connected to the peripheral circuit element PT through the through via 166. For example, a second wiring structure 260 connected to the peripheral circuit element PT may be formed inside the second inter-wiring insulating film 240. The through via 166 may extend in the third direction Z to connect the first wiring structure 180 and the second wiring structure 260. Accordingly, the bit line BL, each of the gate electrodes ECL, GSL1, GSL2, WL11 to WL1*n*, WL21 to WL2*n*, SSL1, and SSL2 and/or the first source structures 102 and 104 may be electrically connected to the peripheral circuit element PT.

In some example embodiments, the through via 166 may penetrate the insulating substrate 101 to connect the first wiring structure 180 and the second wiring structure 260. Accordingly, the through via 166 may be electrically separated from the cell substrate 100.

Figure 8:
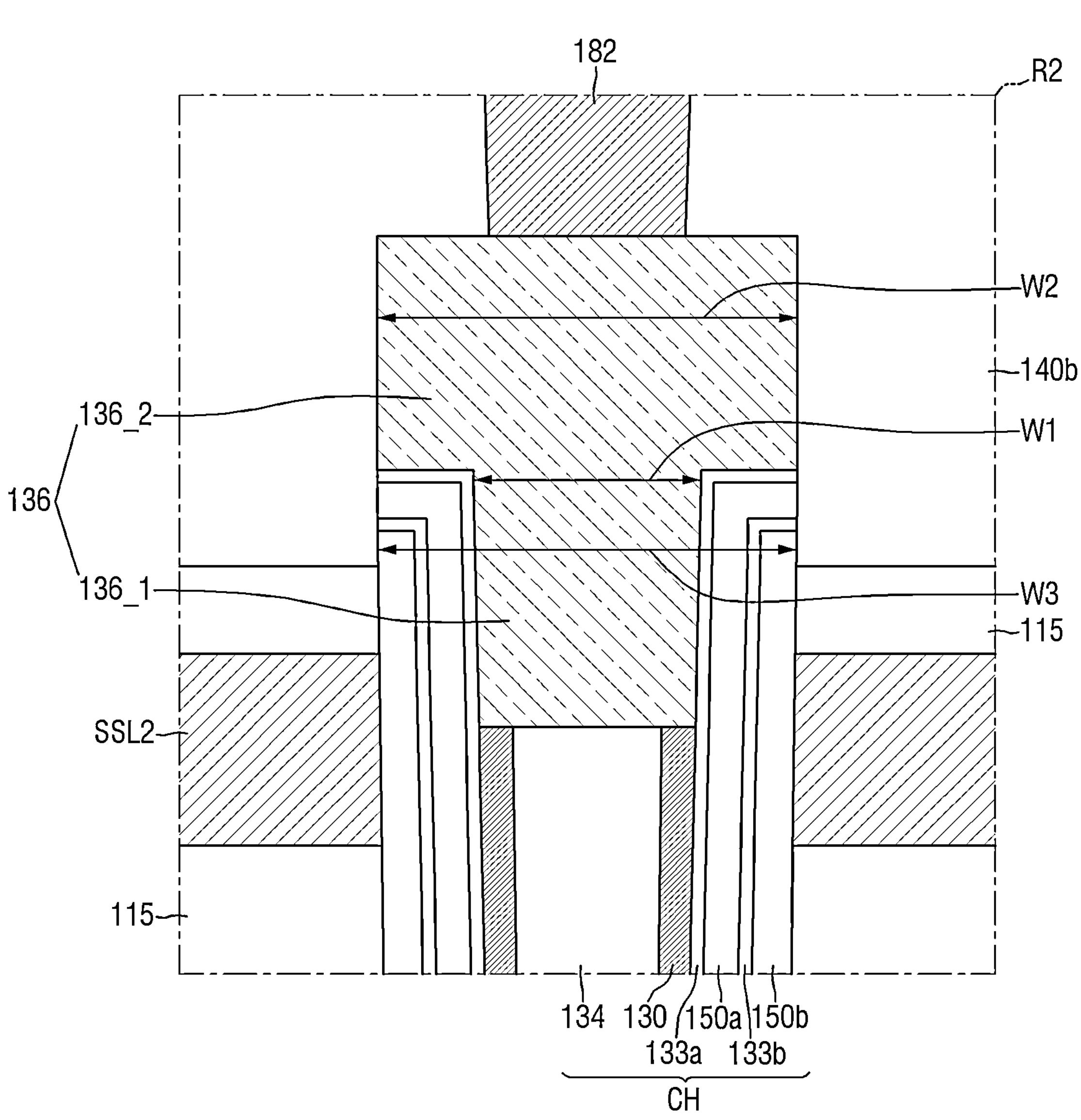
FIG. 8 is a diagram for explaining a semiconductor memory device according to an example embodiment.

FIG. 8 is a diagram for explaining a semiconductor memory device according to an example embodiment. For convenience of explanation, the points different from those explained in FIGS. 1 to 7 will be mainly explained.

Referring to FIG. 8, the channel structure CH may include a semiconductor pattern 130, a charging pattern 134, a first interfacial film 133*a*, a second interfacial film 133*b*, a first ferroelectric film 150*a*, and a second ferroelectric film 150*b*.

The semiconductor pattern 130 may extend in the third direction Z and penetrate the mold structures MS1 and MS2. Although the semiconductor pattern 130 is only shown to have a cup shape, this is only an example. For example, the semiconductor pattern 130 may have various shapes such as a cylindrical shape, a rectangular barrel shape, and a solid filler shape. The semiconductor pattern 130 may include, for example, but not limited to, semiconductor materials such as monocrystalline silicon, polycrystalline silicon, organic semiconductor substance, and carbon nanostructure.

A first interfacial film 133*a* may be disposed on the semiconductor pattern 130. The first interfacial film 133*a* may be interposed between the semiconductor pattern 120 and each of the gate electrodes ECL, GSL1, GSL2, WL11 to WL1*n*, WL21 to WL2*n*, SSL1, and SSL2. For example, the first interfacial film 133*a* may extend along the outer side face of the semiconductor pattern 130. The first interfacial film 133*a* may be in contact with the channel pad 136. The channel pad 136 may be disposed on the first interfacial film 133*a*.

The first ferroelectric film 150*a* may be disposed on the first interfacial film 133*a*. The first ferroelectric film 150*a* may be formed along the first interfacial film 133*a*. The first ferroelectric film 150*a* may be disposed between the semiconductor pattern 130 and each of the gate electrodes ECL, GSL1, GSL2, WL11 to WL1*n*, WL21 to WL2*n*, SSL1, and SSL2.

The upper side of the first ferroelectric film 150*a* may protrude beyond the upper side of the second mold structure MS2. The upper side of the first ferroelectric film 150*a* may protrude in the third direction Z beyond the second mold insulating film 115 and the gate electrode SSL2 disposed at the uppermost part of the second mold structure MS2. The uppermost part of the first interfacial film 133*a* may cover the upper side of the first ferroelectric film 150*a*. The uppermost part of the first ferroelectric film 150*a* may have an L shape rotated by 180 degrees. The first interfacial film 133*a* may have an L shape rotated by 180 degrees.

The second interfacial film 133*b* may be disposed on the first interfacial film 133*a*. The second interfacial film 133*b* may be formed along the first interfacial film 133*a*. The second interfacial film 133*b* may be disposed between the first interfacial film 133*a* and each of the gate electrodes ECL, GSL1, GSL2, WL11 to WL1*n*, WL21 to WL2*n*, SSL1, and SSL2.

The second ferroelectric film 150*b* may be disposed on the second interfacial film 133*b*. The second ferroelectric film 150*b* may be formed along the second interfacial film 133*b*. The second ferroelectric film 150*a* may be disposed between the first ferroelectric film 150*a* and each of the gate electrodes ECL, GSL1, GSL2, WL11 to WL1*n*, WL21 to WL2*n*, SSL1, and SSL2.

The upper side of the second ferroelectric film 150*b* may protrude beyond the upper side of the second mold structure MS2. The upper side of the second ferroelectric film 150*b* may protrude in the third direction Z beyond the second mold insulating film 115 and the gate electrode SSL2 disposed at the uppermost part of the second mold structure MS2. The uppermost part of the second interfacial film 133*b* may cover the upper side of the second ferroelectric film 150*b*. The second interfacial film 133*b* may have an L shape rotated by 180 degrees.

Each of the first interfacial film 133*a* and the second interfacial film 133*b* may include, for example, silicon oxide or a high dielectric constant material (e.g., aluminum oxide ($Al_2O_3$)) having a higher dielectric constant than silicon oxide, and at least one of silicon oxide or silicon nitride.

A description of materials for the first ferroelectric film 150*a* and the second ferroelectric film 150*b* may be the same as that of the ferroelectric film 150 described in FIGS. 1 to 7.

In the semiconductor device according to some example embodiments, when including a plurality of ferroelectric films and the interfacial film, the characteristics of the semiconductor memory device may be improved. For example, a memory window of the non-volatile memory device may be increased.

As the size of the semiconductor memory device decreases, the size of the channel pad 136 decreases. This may cause a misalignment between the channel pad 136 and the bit line contact 182. In the semiconductor memory device according to the present disclosure, because the width of the second portion 136_2 of the channel pad 136 is larger than the width of the first portion 136_1, misalignment between the channel pad 136 and the bit line contact 182 may decrease.

For example, when using a ferroelectricity material and including a plurality of ferroelectric films, the width of the semiconductor pattern may excessively decrease. If the width of the channel pad is the same as the semiconductor pattern, misalignment between the channel pad and the bit line contact may occur. Because the semiconductor device according to some example embodiments of the present disclosure may increase the width of the channel pad 136 regardless of the width of the semiconductor pattern 130, reliability of the semiconductor memory device may be improved.

Figure 9:
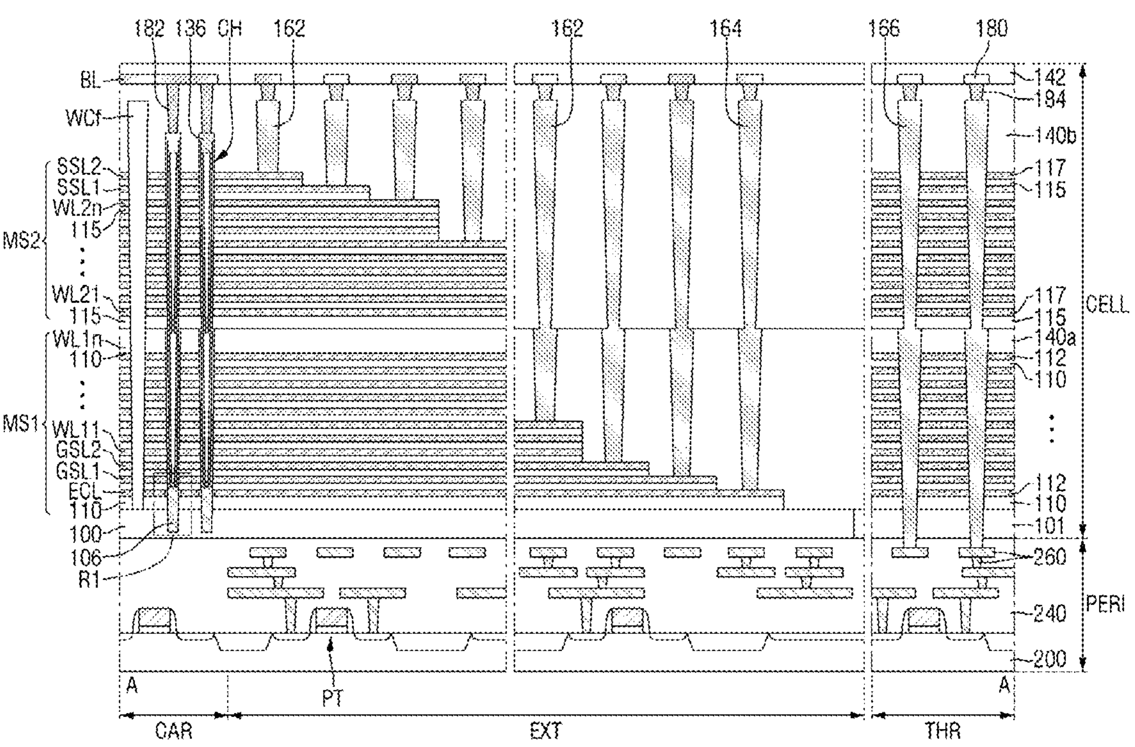
FIGS. 9 and 10 are diagrams for explaining a semiconductor memory device according to an example embodiment.
Figure 10:
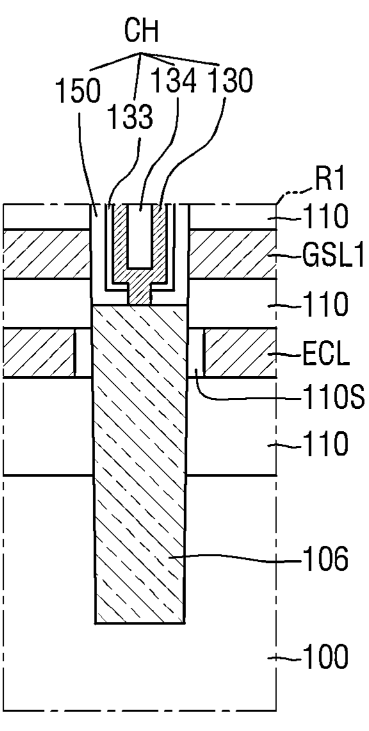

FIGS. 9 and 10 are diagrams for explaining a semiconductor memory device according to an example embodiment. For reference, FIG. 10 is an enlarged view for explaining a region R1 of FIG. 9. For convenience of explanation, the points different from those explained in FIGS. 1 to 7 will be mainly explained.

Referring to FIGS. 9 and 10, the semiconductor memory device according to an example embodiment includes a second source structure 106.

The second source structure 106 may be formed on the cell substrate 100. Although the lower part of the second source structure 106 is only shown as being disposed inside the cell substrate 100, this is only an example. The second source structure 106 may be connected to the semiconductor pattern 130 of the channel structure CH. For example, the semiconductor pattern 130 may penetrate the ferroelectric film 150 and be in contact with the upper side of the second source structure 106. The second source structure 106 may be formed by, for example, but not limited to, a selective epitaxial growth process from the cell substrate 100.

In some example embodiments, the upper side of the second source structure 106 may intersect some of the gate electrodes ECL, GSL1, GSL2, WL11 to WL**1*n*, WL21 to WL2*n*, SSL1, and SSL2. As an example, the upper side of the second source structure 106 may be formed to be higher than the upper side of the erasure control line ECL. In such a case, a gate insulating film 110S may be interposed between the gate electrode (e.g., the erasure control line ECL) intersecting the second source structure 106 and the second source structure 106**.

Figure 11:
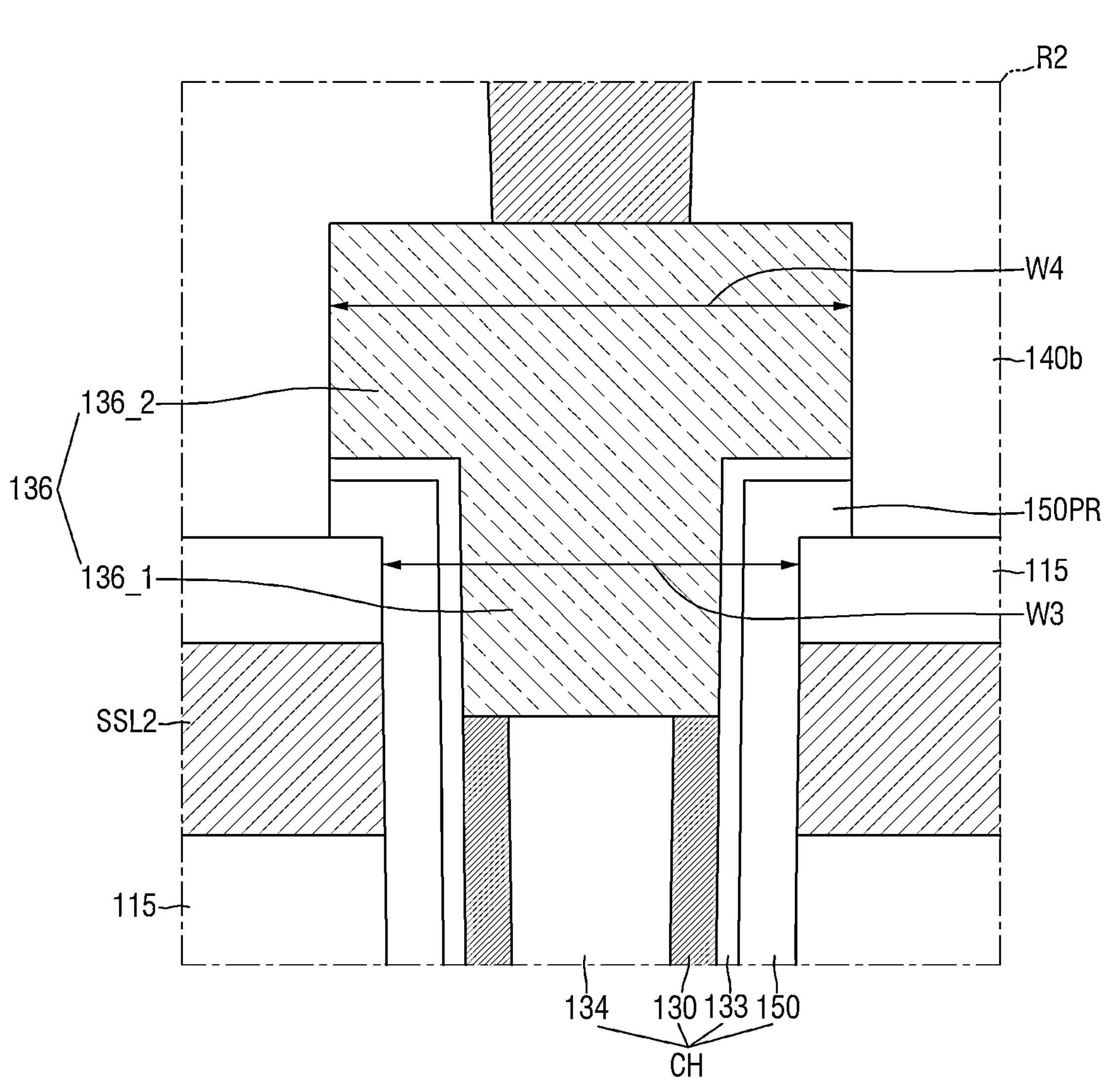
FIG. 11 is a diagram for explaining a semiconductor memory device according to an example embodiment.

FIG. 11 is a diagram for explaining a semiconductor memory device according to an example embodiment. For convenience of explanation, the points different from those explained in FIGS. 1 to 7 will be mainly explained.

The ferroelectric film 150 may include a protruding part 150PR. The protruding part 150PR may be disposed on the second mold structure MS2. The protruding part 150PR may be disposed on the upper side of the second mold structure MS2. For example, the protruding part 150PR may be disposed on the second mold insulating film 115 disposed at the uppermost part of the second mold structure MS2. The protruding part 150PR may overlap the second mold structure MS2 in the third direction Z.

The interfacial film 133 may be disposed on the ferroelectric film 150. The interfacial film 133 may cover the upper side of the ferroelectric film 150. The interfacial film 133 may be disposed on the protruding part 150PR of the ferroelectric film 150.

The second portion 136_2 of the channel pad 136 may have a fourth width W4. The channel structure CH may have a third width W3. The fourth width W4 is greater than the third width W3. The third width W3 may mean the largest width among the widths of the channel structure CH disposed inside the second mold structure MS2.

Figure 12:
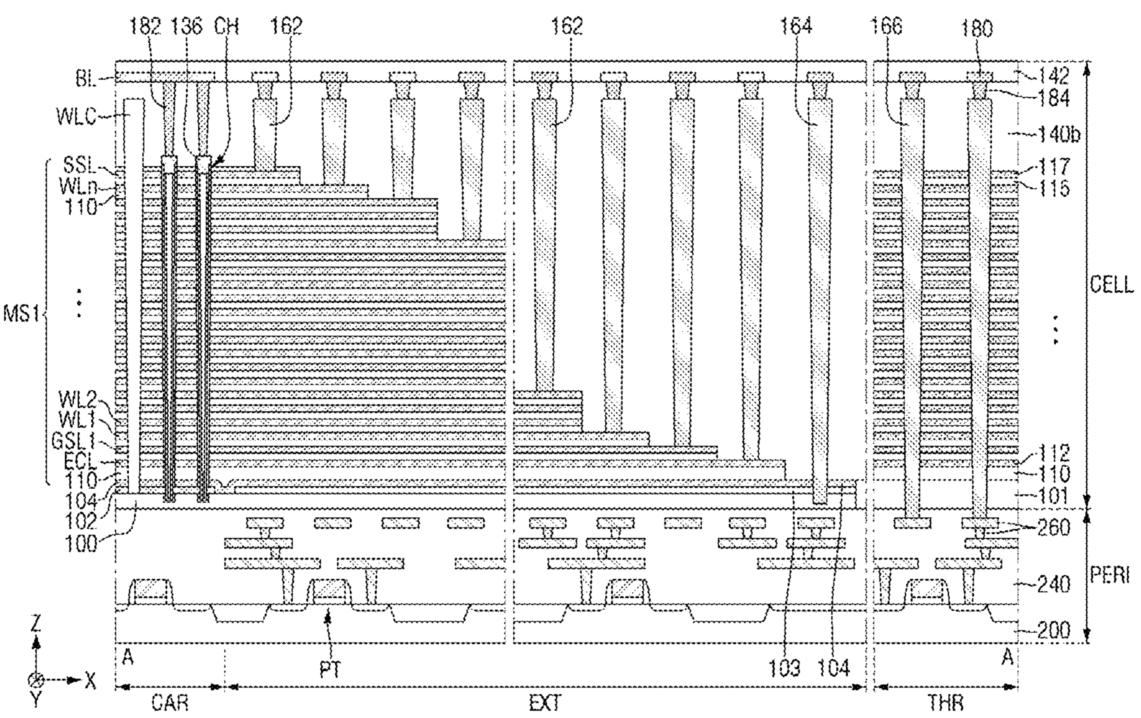
FIG. 12 is a diagram for explaining a semiconductor memory device according to an example embodiment.

FIG. 12 is a diagram for explaining a semiconductor memory device according to an example embodiment. For convenience of explanation, the points different from those explained in FIGS. 1 to 7 will be mainly explained.

Referring to FIG. 12, the semiconductor memory device according to an example embodiment may include only the first mold structure MS1. That is, the semiconductor memory device according to the example embodiment may have a single stack structure. The channel structure CH, the cell contact 162, the source contact 164 and the through via 166 do not have a bent part.

Figure 13:
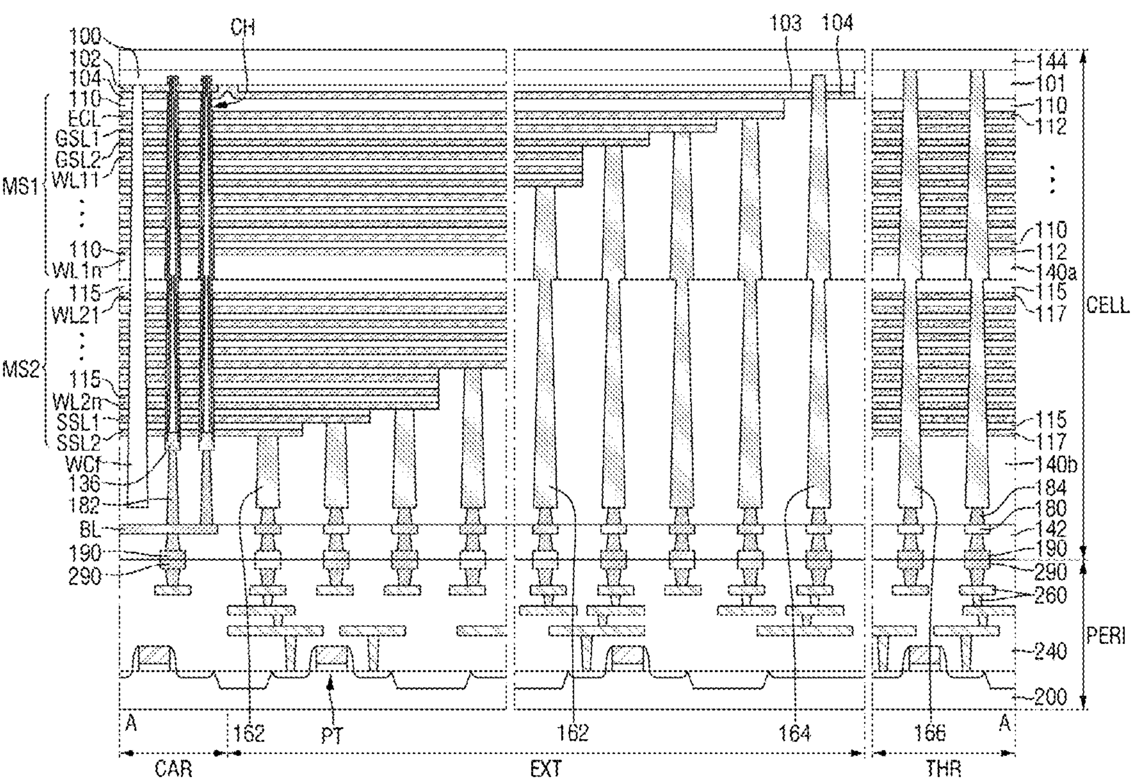
FIG. 13 is a diagram for explaining a semiconductor memory device according to an example embodiment.

FIG. 13 is a diagram for explaining a semiconductor memory device according to an example embodiment.

Referring to FIG. 13, in the semiconductor memory device according to an example embodiment, the front side of the cell substrate 100 is opposite to the front side of the peripheral circuit board 200.

For example, the semiconductor memory device according to some example embodiments may be a C2C (chip-to-chip) structure. The C2C structure may mean a structure in which an upper chip including a memory cell region CELL is manufactured on a first wafer (e.g., the cell substrate 100), and a lower chip including a peripheral circuit region PERI is manufactured on a second wafer (e.g., the peripheral circuit board 200) different from the first wafer, and then, the upper chip and the lower chip are connected to each other by a bonding way.

As an example, the bonding way may mean a way of electrically connecting a first bonding metal 190 formed on the uppermost metal layer of the upper chip and a second bonding metal 290 formed on the uppermost metal layer of the lower chip. For example, when the first bonding metal 190 and the second bonding metal 290 are formed of copper (Cu), the bonding type may be a Cu—Cu bonding type. However, this is an example only, and the first bonding metal 190 and the second bonding metal 290 may, of course, be formed of various other metals such as aluminum (Al) or tungsten (W).

As the first bonding metal 190 and the second bonding metal 290 are bonded, the first wiring structure 180 may be connected to the second wiring structure 260. Accordingly, the bit line BL, each of the gate electrodes ECL, GSL1, GSL2, WL11 to WL**1*n*, WL21 to WL2*n*, SSL1, and SSL2 and/or the first source structures 102 and 104** may be electrically connected to the peripheral circuit element PT.

Figure 14:
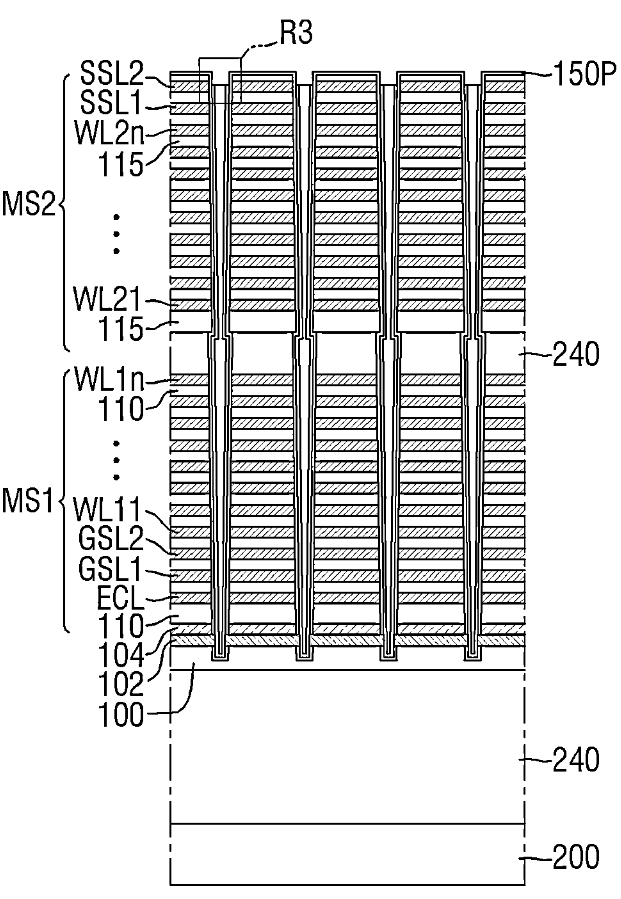
FIGS. 14 to 17 are intermediate step diagrams for explaining a method for fabricating a semiconductor memory device according to an example embodiment.
Figure 15:
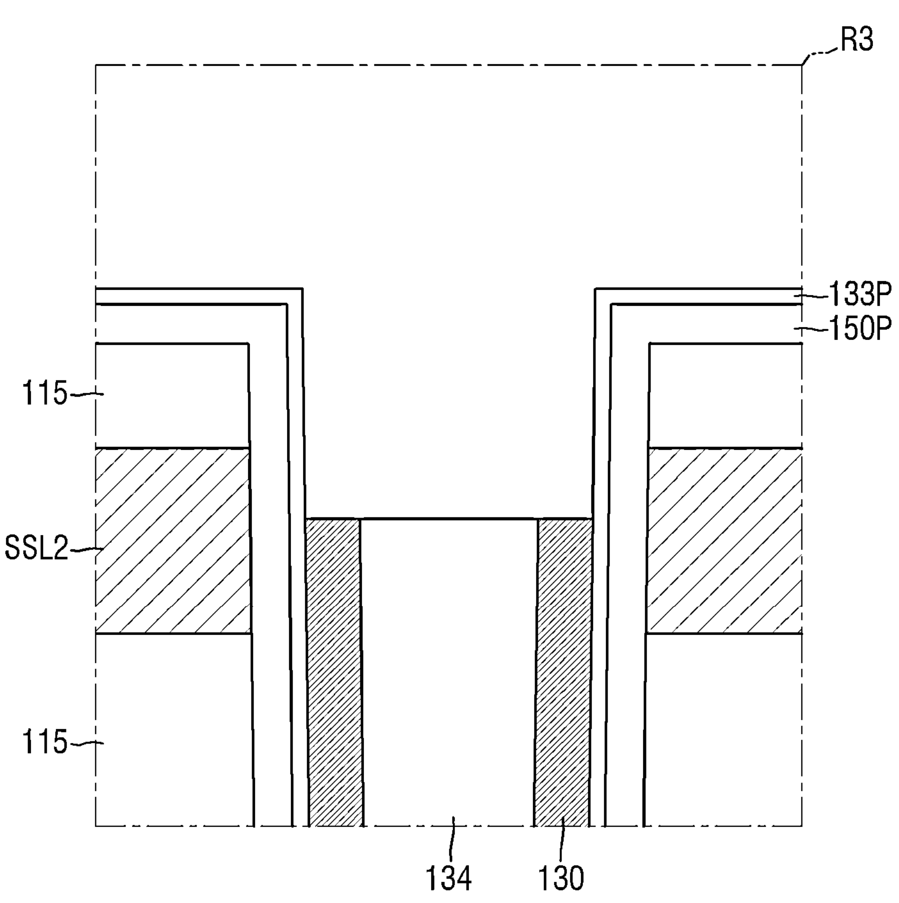

FIGS. 14 to 17 are intermediate step diagrams for explaining a method for fabricating a semiconductor memory device according to an example embodiment. For reference, FIG. 15 is an enlarged view for explaining a portion R3 of FIG. 14. For convenience of explanation, a portion in which the channel structure CH of the cell array region CAR is formed will be mainly explained.

Referring to FIGS. 14 and 15, a pre-ferroelectric film 150P may be formed on the first mold structure MS1 and the second mold structure MS2.

For example, the first mold structure MS1 and the second mold structure MS2 may be formed on the peripheral circuit board 200 and the second inter-wiring insulating film 240. Unlike the shown example, a first mold structure MS1 and a second mold structure MS2 may be formed, and a second inter-wiring insulating film 240 and a peripheral circuit board 200 may be formed.

A channel hole which penetrates the first mold structure MS1 and the second mold structure MS2 may be formed. The pre-ferroelectric film 150P may be formed along the inner side wall of the channel hole. The pre-ferroelectric film 150P may cover the upper side of the second mold structure MS2. For example, the pre-ferroelectric film 150P may cover the upper side of the second mold insulating film 115 disposed at the uppermost part of the second mold structure MS2.

Subsequently, a pre-interfacial film 133P may be formed along the pre-ferroelectric film 150P. The pre-interfacial film 133P may be formed along the profile of the pre-ferroelectric film 150P.

A semiconductor pattern 130 may be formed on the pre-interfacial film 133P. A filling pattern 134 may be formed on the semiconductor pattern 130. The semiconductor pattern 130 and the filling pattern 134 may fill the portion that is left over after filling the channel hole by the pre-ferroelectric film 150P and the pre-interfacial film 133P.

Figure 16:
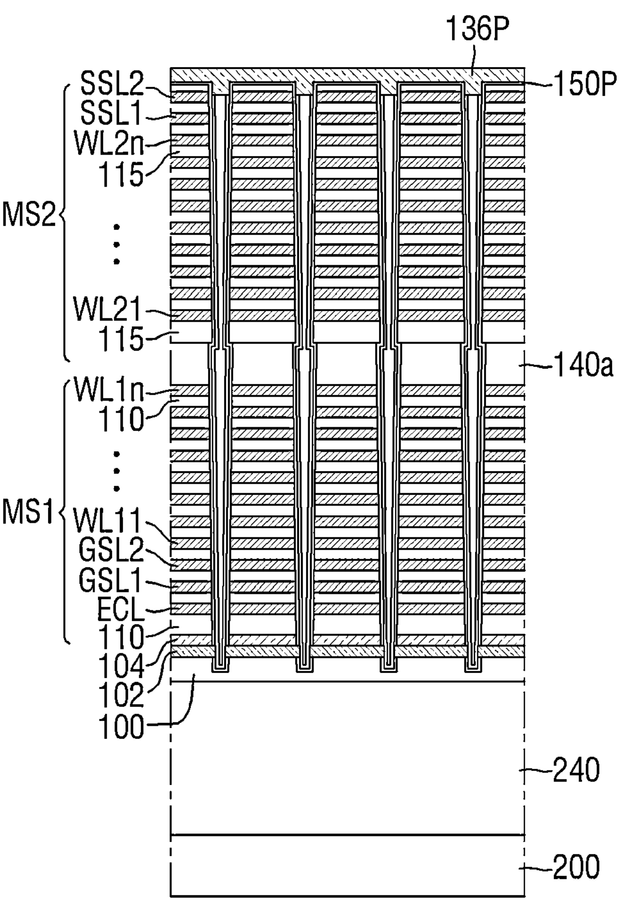

Referring to FIG. 16, a pre-channel pad 136P may be formed on the pre-interfacial film 133P, the semiconductor pattern 130 and the filling pattern 134.

The pre-channel pad 136P may cover the second mold structure MS2. The pre-channel pad 136P may be disposed on the pre-ferroelectric film 150P and the pre-interfacial film 133P. The pre-channel pad 136P may be in contact with the semiconductor pattern 130.

Figure 17:
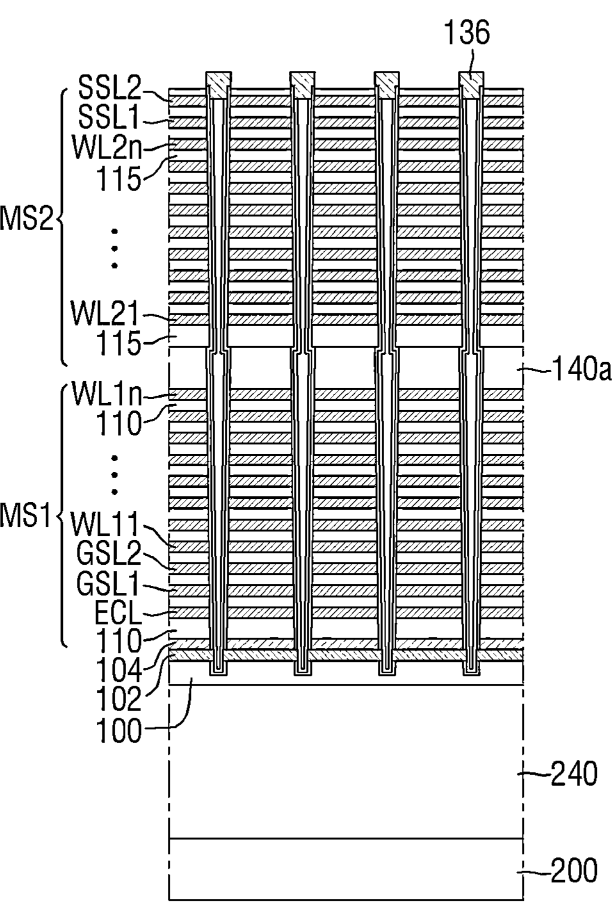

Referring to FIG. 17, a channel pad 136 and a channel structure CH may be formed on the second mold structure MS2.

The channel pad 136 may be formed by etching the pre-channel pad 136P of FIG. 16 through an etching process. The etching process may use, for example, an etching mask for forming the channel holes. In such a case, because the etching mask for forming the channel pad 136 is the same as the etching mask for forming the channel hole, the number of process steps may decrease.

The channel structure CH may be formed by the etching process. For example, when the channel pad 136 is formed, the pre-interfacial film 133P and the pre-ferroelectric film 150P may be etched to form the interfacial film 133 and the ferroelectric film 150.

Subsequently, a second interlayer insulating film 140*b*, a bit line contact 182, a bit line BL, and the like may be formed on the second mold structure MS2.

An electronic system including the semiconductor memory device according to some example embodiments will be described below with reference to FIGS. 18 to 20.

Figure 18:
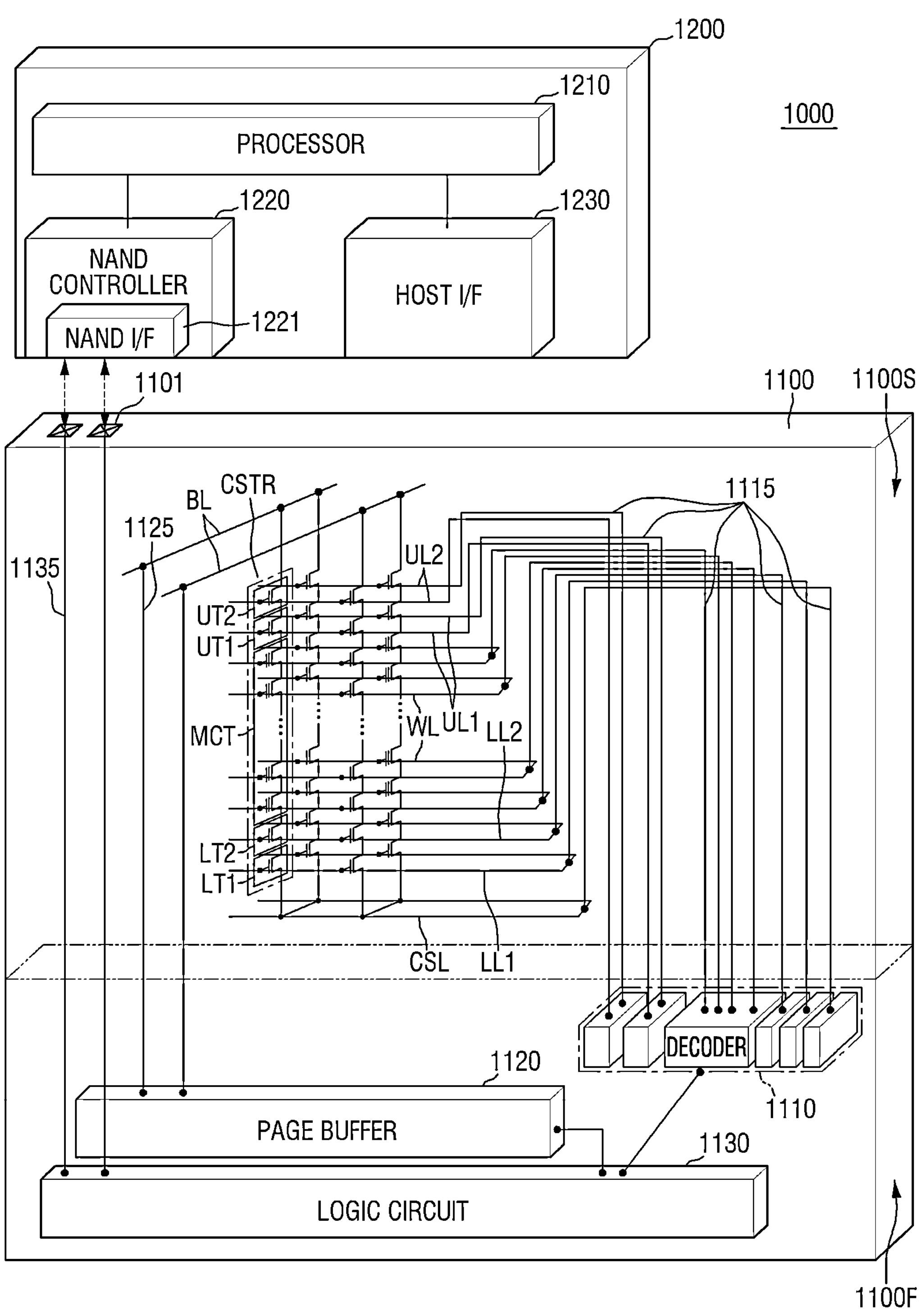
FIG. 18 is an example block diagram for explaining the electronic system according to an example embodiment.

FIG. 18 is an example block diagram for explaining the electronic system according to an example embodiment. FIG. 19 is an example perspective view for explaining an electronic system according to an example embodiment. FIG. 20 is a schematic cross-sectional view taken along a line I-I of FIG. 19.

Referring to FIG. 18, an electronic system 1000 according to an example embodiment may include a semiconductor memory device 1100, and a controller 1200 electrically connected to the semiconductor memory device 1100. The electronic system 1000 may be a storage device that includes one or multiple semiconductor storage devices 1100 or an electronic device that includes the storage device. For example, the electronic system 1000 may be a solid state drive device (SSD) including one or multiple semiconductor memory devices 1100, a universal serial bus (USB), a computing system, a medical device or a communication device.

The semiconductor memory device 1100 may be a non-volatile memory device (e.g., a NAND flash memory device), and may be, for example, the semiconductor memory device explained above using FIGS. 1 to 12. The semiconductor memory device 1100 may include a first structure 1100F, and a second structure 1100S on the first structure 1100F.

The first structure 1100F may be a peripheral circuit structure that includes a decoder circuit 1110 (e.g., the row decoder 33 of FIG. 1), a page buffer 1120 (e.g., the page buffer 35 of FIG. 1), and a logic circuit 1130 (e.g., the control logic 37 of FIG. 1).

The second structure 1100S may include the common source line CSL, a plurality of bit lines BL, and a plurality of cell strings CSTR explained above using FIG. 2. The cell strings CSTR may be connected to the decoder circuit 1110 through the word line WL, at least one string selection line SSL, and at least one ground selection line GSL. In addition, the cell strings CSTR may be connected to the page buffer 1120 through the bit lines BL.

In some example embodiments, the common source line CSL and the cell strings CSTR may be electrically connected to the decoder circuit 1110 through first connection wirings 1115 extending from the first structure 1100F to the second structure 1100S. The first connection wiring 1115 may correspond to the through via 166 explained above using FIGS. 1 to 12. That is, the through via 166 may electrically connect each of the gate electrodes ECL, GSL, WL, and SSL and the decoder circuit 1110 (e.g., the row decoder 33 of FIG. 1).

In some example embodiments, the bit lines BL may be electrically connected to the page buffer 1120 through the second connection wirings 1125 extending from the first structure 1100F to the second structure 1100S. The second connection wiring 1125 may correspond to the through via 166 explained above using FIGS. 1 to 12. That is, the through via 166 may electrically connect the bit lines BL and the page buffer 1120 (e.g., the page buffer 35 of FIG. 1).

The semiconductor memory device 1100 may communicate with the controller 1200 through an I/O pad 1101 electrically connected to the logic circuit 1130 (e.g., the control logic 37 of FIG. 11). The I/O pad 1101 may be electrically connected to the logic circuit 1130 through the I/O connection wiring 1135 extending from the inside of the first structure 1100F to the second structure 1100S.

The controller 1200 may include a processor 1210, a NAND controller 1220, and a host interface 1230. In some example embodiments, the electronic system 1000 may include a plurality of semiconductor memory devices 1100, and in this case, the controller 1200 may control the plurality of semiconductor memory devices 1100.

The processor 1210 may control the operation of the overall electronic system 1000 including the controller 1200. The processor 1210 may operate according to a desired (or alternatively, predetermined) firmware, and may control the NAND controller 1220 to access the semiconductor memory device 1100. The NAND controller 1220 may include a NAND interface 1221 that processes communication with the semiconductor memory device 1100. Control command for controlling the semiconductor memory device 1100, data to be recorded in the memory cell transistors MCT of the semiconductor memory device 1100, data to be read from the memory cell transistors MCT of the semiconductor memory device 1100, and the like may be transmitted through the NAND interface 1221. The host interface 1230 may provide a communication function between the electronic system 1000 and an external host. When the control command is received from the external host through the host interface 1230, the processor 1210 may control the semiconductor memory device 1100 in response to the control command.

Figure 19:
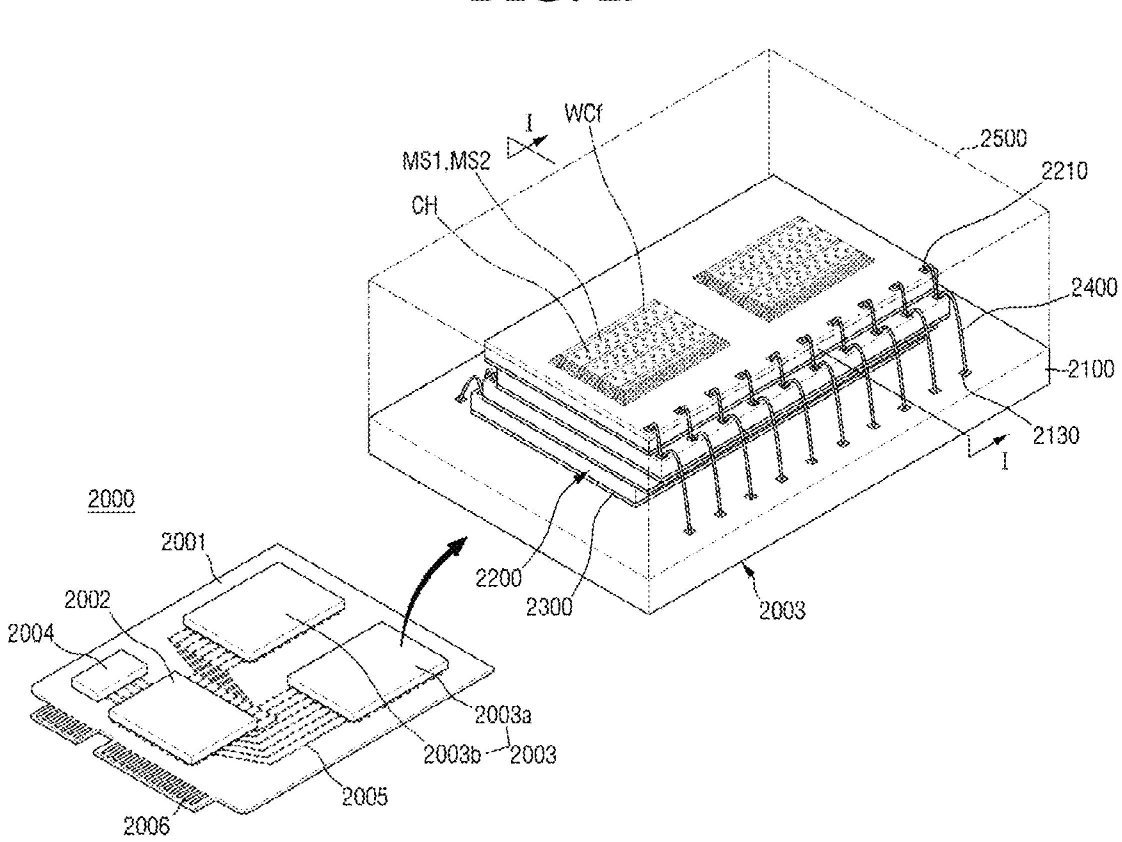
FIG. 19 is an example perspective view for explaining an electronic system according to an example embodiment.
Figure 20:
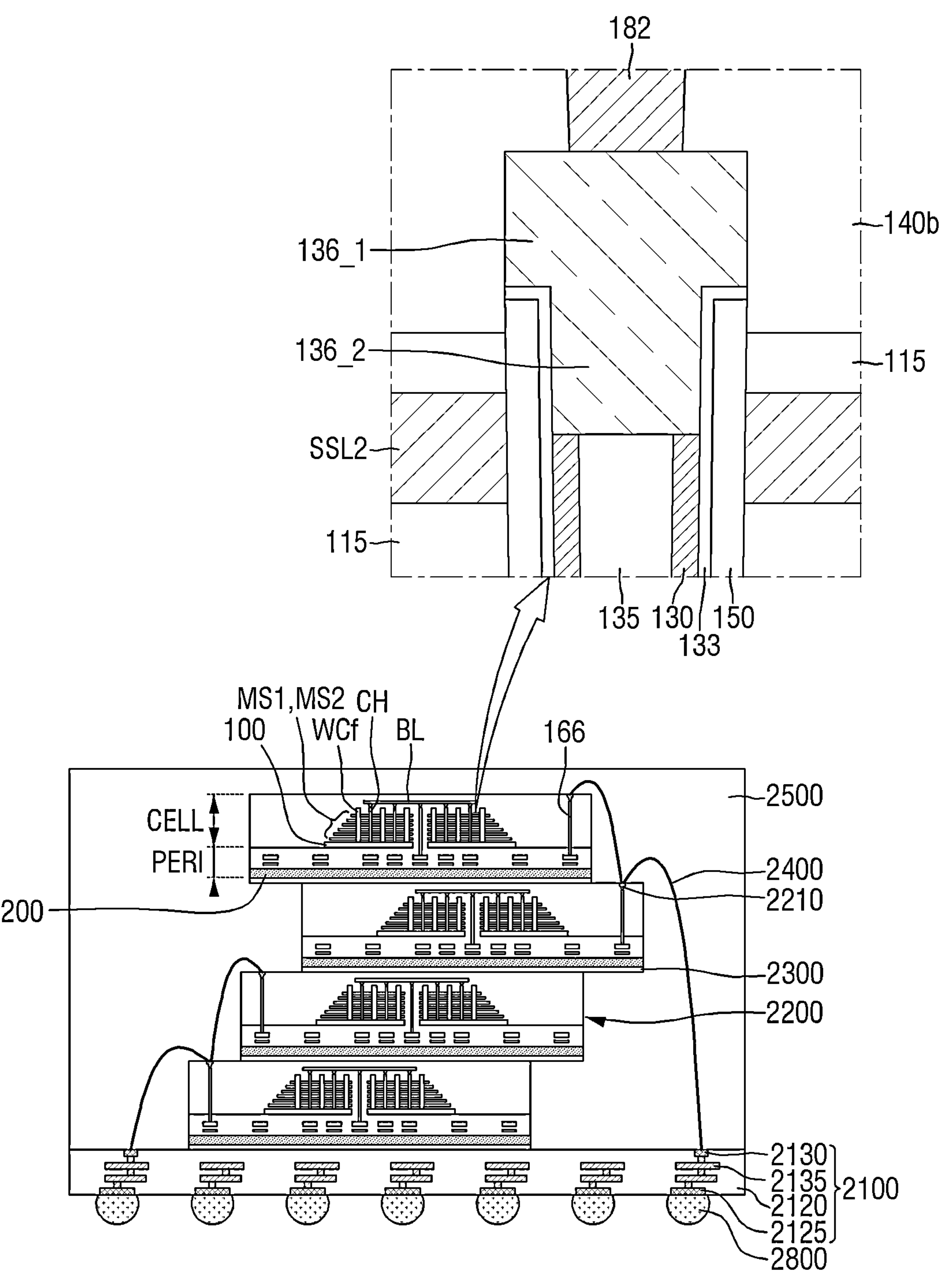
FIG. 20 is a schematic cross-sectional view taken along a line I-I of FIG. 19.

Referring to FIGS. 19 and 20, the electronic system according to an example embodiment may include a main board 2001, a main controller 2002 mounted on the main board 2001, one or more semiconductor packages 2003, and a DRAM 2004. The semiconductor package 2003 and the DRAM 2004 may be connected to the main controller 2002 by wiring patterns 2005 formed on the main board 2001.

The main board 2001 may include a connector 2006 including a plurality of fins configured to be coupled to an external host. In the connector 2006, the number and placement of the plurality of fins may vary depending on the communication interface between the electronic system 2000 and the external host. In some example embodiments, the electronic system 2000 may communicate with the external host according to any one of interfaces such as M-Phy for USB (Universal Serial Bus), PCI-Express (Peripheral Component Interconnect Express), SATA (Serial Advanced Technology Attachment), or UFS (Universal Flash Storage). In some example embodiments, the electronic system 2000 may operate by power supplied from the external host through the connector 2006. The electronic system 2000 may further include a power management integrated circuit (PMIC) that distributes the power supplied from the external host to the main controller 2002 and the semiconductor package 2003.

The main controller 2002 may record data in the semiconductor package 2003 or read data from the semiconductor package 2003, and may improve the operating speed of the electronic system 2000.

The DRAM 2004 may be a buffer memory for relieving a speed difference between the semiconductor package 2003, which is a data storage space, and the external host. The DRAM 2004 included in the electronic system 2000 may also operate as a kind of cache memory, and may also provide a space for temporarily storing data in the control operation on the semiconductor package 2003. When the DRAM 2004 is included in the electronic system 2000, the main controller 2002 may further include a DRAM controller for controlling the DRAM 2004, in addition to a NAND controller for controlling the semiconductor package 2003.

The semiconductor package 2003 may include a first semiconductor package 2003*a* and a second semiconductor package 2003*b* that are spaced apart from each other. The first semiconductor package 2003*a* and the second semiconductor package 2003*b* each may be a semiconductor package that includes a plurality of semiconductor chips 2200. The first semiconductor package 2003*a* and the second semiconductor package 2003*b* each may include a package substrate 2100, semiconductor chips 2200 on the package substrate 2100, adhesive layers 2300 disposed on the lower sides of each of the package chips 220, a connecting structure 2400 for electrically connecting the semiconductor chips 2200 and the package substrate 2100, and a molding layer 2500 that covers the semiconductor chips 2200 and the connecting structure 2400 on the package substrate 2100.

The package substrate 2100 may be a printed circuit board that includes package upper pads 2130. Each semiconductor chip 2200 may include an I/O pad 2210. The I/O pad 2210 may correspond to the I/O pad 1101 of FIG. 17.

In some example embodiments, the connecting structure 2400 may be a bonding wire that electrically connects the I/O pad 2210 and the package upper pads 2130. Therefore, in each of the first semiconductor packages 2003*a* and the second semiconductor packages 2003*b*, the semiconductor chips 2200 may be electrically connected to each other by a bonding wire type, and may be electrically connected to the package upper pads 2130 of the package substrate 2100. In some example embodiments, in each of the first semiconductor packages 2003*a* and the second semiconductor packages 2003*b*, the semiconductor chips 2200 may be electrically connected to each other by a connecting structure including a through electrode (Through Silicon Via, TSV) instead of the connecting structure 2400 of the bonding wire type.

In some example embodiments, the main controller 2002 and the semiconductor chips 2200 may be included in a single package. In some example embodiments, the main controller 2002 and the semiconductor chips 2200 are mounted on a separate interposer substrate different from the main board 2001, and the main controller 2002 and the semiconductor chips 2200 may be connected to each other by the wiring formed on the interposer substrate.

In some example embodiments, the package substrate 2100 may be a printed circuit board. The package substrate 2100 may include a package substrate body portion 2120, package upper pads 2130 disposed on an upper surface of the package substrate body portion 2120, lower pads 2125 disposed on a lower surface of the package substrate body portion 2120 or exposed through the lower surface, and inner wirings 2135 that electrically connect the upper pads 2130 and the lower pads 2125 inside the package substrate body portion 2120. The upper pads 2130 may be electrically connected to the connecting structures 2400. The lower pads 2125 may be connected to the wiring patterns 2005 of the main board 2001 of the electronic system 2000 through conductive connections 2800, as in FIG. 19.

In the electronic system according to some example embodiments, each of the semiconductor chips 2200 may include the semiconductor memory device explained above using FIGS. 1 to 12. For example, each of the semiconductor chips 2200 may include a peripheral circuit region PERI, and a memory cell region CELL stacked on the peripheral circuit region PERI. As an example, the peripheral circuit region PERI may include the peripheral circuit board 200 and the second wiring structure 260 explained above using FIGS. 3 to 7. Further, as an example, the memory cell region CELL may include the cell substrate 100, the mold structures MS1 and MS2, and the channel structure CH explained above using FIGS. 3 to 7.

Any functional blocks shown in the figures and described above may be implemented in processing circuitry such as hardware including logic circuits, a hardware/software combination such as a processor executing software, or a combination thereof. For example, the processing circuitry more for example may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

In concluding the detailed description, those skilled in the art will appreciate that many variations and modifications may be made to the disclosed example embodiments without substantially departing from the principles of the present inventive concepts. Therefore, the disclosed example embodiments of the inventive concepts are used in a generic and descriptive sense only and not for purposes of limitation.

What is claimed is:

1. A semiconductor memory device comprising:

a substrate;

a mold structure including a plurality of gate electrodes and a plurality of mold insulating films alternately stacked on the substrate;

a channel structure extending in a first direction and penetrating the mold structure, the channel structure including a semiconductor pattern and a ferroelectric film between the semiconductor pattern and the plurality of gate electrodes;

a channel pad on the channel structure; and a bit line contact connected to the channel pad, wherein an uppermost part of the ferroelectric film protrudes beyond an uppermost gate electrode among the plurality of gate electrodes, the channel pad includes a first portion that is in contact with the semiconductor pattern, and a second portion that is in contact with the first portion and the bit line contact, the first portion has a first width, and the second portion has a second width greater than the first width.

2. The semiconductor memory device of claim 1, wherein the uppermost part of the ferroelectric film protrudes beyond an upper side of the mold structure.

3. The semiconductor memory device of claim 1, wherein the channel structure includes an interfacial film between the ferroelectric film and the semiconductor pattern.

4. The semiconductor memory device of claim 3, wherein a part of the interfacial film covers an upper side of the ferroelectric film.

5. The semiconductor memory device of claim 3, wherein a part of the interfacial film is between the ferroelectric film and the second portion of the channel pad.

6. The semiconductor memory device of claim 1, wherein the ferroelectric film includes a protruding part, and the protruding part overlaps a part of the plurality of gate electrodes in the first direction.

7. The semiconductor memory device of claim 1, further comprising:

a source layer in contact with the semiconductor pattern.

8. The semiconductor memory device of claim 1, wherein the ferroelectric film is in direct contact with the plurality of gate electrodes.

9. The semiconductor memory device of claim 1, wherein an uppermost part of the channel structure has a third width, and the third width is same as the second width of the second portion.

10. The semiconductor memory device of claim 1, wherein an uppermost part of the channel structure has a third width, and the third width is smaller than the second width of the second portion.

11. A semiconductor memory device comprising:

a substrate;

a mold structure including a plurality of gate electrodes and a plurality of mold insulating films alternately stacked on the substrate;

a channel structure extending in a first direction and penetrating the mold structure; and a channel pad on the channel structure, the channel pad including a first portion having a first width and a second portion having a second width greater than the first width, wherein the channel structure includes, a semiconductor pattern, a first interfacial film on the semiconductor pattern, a first ferroelectric film on the first interfacial film, a second interfacial film on the first ferroelectric film, and a second ferroelectric film on the second interfacial film.

12. The semiconductor memory device of claim 11, wherein the second ferroelectric film is in contact with the plurality of gate electrodes.

13. The semiconductor memory device of claim 11, wherein the first interfacial film covers an upper side of the first ferroelectric film.

14. The semiconductor memory device of claim 11, wherein the second interfacial film covers an upper side of the second ferroelectric film.

15. The semiconductor memory device of claim 11, wherein the semiconductor pattern is in contact with the first portion of the channel pad.

16. The semiconductor memory device of claim 11, wherein an uppermost part of the second ferroelectric film protrudes beyond an upper side of the mold structure.

17. The semiconductor memory device of claim 11, wherein an uppermost part of the channel structure has a third width, and the third width is same as the second width of the second portion.

18. The semiconductor memory device of claim 11, wherein an uppermost part of the second ferroelectric film protrudes beyond an uppermost gate electrode among the plurality of gate electrodes.

19. An electronic system comprising:

a main board;

a semiconductor memory device on the main board; and a controller on the main board and electrically connected to the semiconductor memory device, wherein the semiconductor memory device includes, a substrate, a mold structure including a plurality of gate electrodes and a plurality of mold insulating films alternately stacked on the substrate, a channel structure extending in a first direction and penetrating the mold structure, the channel structure including a semiconductor pattern and a ferroelectric film between the semiconductor pattern and the plurality of gate electrodes, a channel pad on the channel structure, and a bit line contact connected to the channel pad, wherein an uppermost part of the ferroelectric film protrudes beyond an uppermost gate electrode among the plurality of gate electrodes, and wherein the channel pad includes a first portion in contact with the semiconductor pattern, and a second portion in contact with the first portion and the bit line contact, the first portion has a first width, and the second portion has a second width greater than the first width.

20. The electronic system of claim 19, wherein the channel structure includes an interfacial film between the ferroelectric film and the semiconductor pattern, and a part of the interfacial film covers an upper side of the ferroelectric film.

* * * * *